(12) United States Patent
Minonishi

(10) Patent No.: US 6,392,205 B1
(45) Date of Patent: May 21, 2002

(54) DISC HEATER AND TEMPERATURE CONTROL APPARATUS

(75) Inventor: Mikio Minonishi, Kanagawa-ken (JP)

(73) Assignee: Komatsu Limited, Tokyo (JP)

( * ) Notice: Subject to any disclaimer, the term of this patent is extended or adjusted under 35 U.S.C. 154(b) by 0 days.

(21) Appl. No.: 09/450,390

(22) Filed: Nov. 29, 1999

(30) Foreign Application Priority Data

Nov. 30, 1998 (JP) .......................................... 10-340074
Oct. 15, 1999 (JP) .......................................... 11-293363

(51) Int. Cl.$^7$ ................................................ H05B 3/68
(52) U.S. Cl. .................................................. 219/443.1
(58) Field of Search .......................... 219/443.1, 444.1, 219/539, 541, 542, 543, 546; 118/724, 725

(56) References Cited

U.S. PATENT DOCUMENTS

| | | | | |
|---|---|---|---|---|
| 2,330,867 A | * | 10/1943 | Challet | 219/546 |
| 5,177,341 A | * | 1/1993 | Balderson | 219/466.1 |
| 5,294,778 A | * | 3/1994 | Carman et al. | 219/444.1 |
| 5,343,022 A | * | 8/1994 | Gilbert, Sr. et al. | 118/725 |
| 5,766,363 A | * | 6/1998 | Mizuno et al. | 118/725 |
| 5,822,675 A | * | 10/1998 | Paquet et al. | 219/543 |
| 5,904,872 A | * | 5/1999 | Arami et al. | 219/444.1 |

* cited by examiner

*Primary Examiner*—Sang Paik
(74) *Attorney, Agent, or Firm*—Bell Boyd & Lloyd LLC

(57) ABSTRACT

A disc heater is applied to a temperature control apparatus which controls a temperature of an object to be processed on at least one surface thereof. In the disc heater, wire-like heating elements are laid on a plate surface in a predetermined pattern and power feeding portions are disposed at ends of the wire-like heating elements. The pattern formed by the wire-like heating elements comprise a large number of arc portions disposed on a large number of concentric circles, and a surface area of the arc portions is 70% or greater, more preferably, 85 to 95% of a surface area of the entire pattern. With this feature, it is possible to effectively reduce the local excessively heated portion to the utmost, and to uniformly heat the entire heating surface, thus realizing an ideal topology pattern of the disc heater.

13 Claims, 18 Drawing Sheets

DISC HEATER AND TEMPERATURE CONTROL APPARATUS

BACKGROUND OF THE INVENTION

1. Field of the Invention

The present invention relates to a disc heater incorporated in a temperature control apparatus which alternately repeats heating and cooling operations in a manufacturing process of semiconductor or in a forming process of various thin films or electrode pattern with respect to glass plate of liquid crystal display, and also relates to a temperature control apparatus provided with the heater. More particularly, the present invention relates to a disc heater in which a wire-like heating element is disposed in one stroke drawing manner onto a plate surface, thereby securing thermal uniformity in a heating surface of the disc heater, and a number of excessively heated local portions is reduced. The present invention also relates to a temperature control apparatus provided with the heater.

2. Description of the Related Art

A disc heater of this kind can be applied to various processing apparatus used in film forming process of manufacture of semiconductors, etching process, photoresist application process, or light exposure process in manufacturing of crystal displays. As disclosed in Japanese Patent Laid-open Publication No. 7-183281 for example, the disc heater of this kind is used for smooth cooling control.

The disc heater disclosed in the above-described publication is a temperature adjusting heater used for controlling cooling temperature at the time of cooling process of semiconductor wafers. In a conventional low temperature processing apparatus to which this temperature adjusting heater is applied, since an electricity feeding pipe used for feeding high frequency electricity or feeding electricity to the heater is disposed in a center of a table on which an object to be processed is placed, cold temperature from a cooling jacket is less prone to be transmitted to the center region of the table. Further, since the heat from the heater is actively transmitted around a periphery of the table and thus, even when the heater is designed such that the calorific value from a heating surface of the heater becomes uniform, the entire heating surface of the heater is not heated uniformly. Therefore, there is a tendency that the center of the heater is higher in temperature than peripheral region. Thus, topology of a wire heating body of the temperature adjusting heater is set rough at a center thereof as compared with a peripheral region thereof, thereby preventing the center from being excessively heated and securing uniform temperature over the entire heating surface.

However, in a temperature control apparatus that the present inventor previously proposed in Japanese Patent Application No. 10-40765, the electricity feeding pipe as described above is not necessarily disposed in the center of the table intensively. In this case, it is preferable that an entire heating surface of the disc heater of this kind is heated uniformly.

On the other hand, in the conventional disc heater as disclosed in Japanese Patent Laid-open Publications Nos. 5-21308 and 7-183281 for example, a thick metal plate having great thermal capacity is interposed between a heating body and an object to be processed. By interposing the metal plate in such a manner, it is possible to uniformly transmit heat from the heating body to the object to be processed through the metal plate, so that it is unnecessary to pay special attention to the topology pattern of the heating body.

However, in a case of a processing apparatus which alternately repeats heating and cooling operations with respect to the object to be processed, it is preferable that after the object is heated for a predetermined time period by swiftly increasing the temperature to a preset processing temperature, the temperature is swiftly lowered to a preset cooling temperature, as shown in FIG. 16. As described above, when the thick metal plate having great thermal capacity is interposed between the heating body and the object to be processed, the thermal transmission is prone to be delayed and its control is difficult. To avoid such problems, it is ideal to bring the heating body into direct contact with the object to be processed and to heat and cool it.

Actually, the heating body is not brought into direct contact with the object to be processed, considering influence on the object to be processed, so that a surface of the heating body is covered with a metal foil which is extremely thin and has high thermal conductivity, such as aluminum foil of 0.5 mm. However, when the heating body is covered with the metal foil having great thermal conductivity, since the object to be processed is largely influenced by the topology pattern of the heating body, higher uniformity of heat of the heating body is required. Therefore, the topology pattern of the heating body becomes important.

FIGS. 17 to 19 show an example of commercially available topology pattern of a wire heating body designed so as to obtain uniform calorific value, and its locally excessively heated state. As can be understood from these drawings, in the topology pattern formed by a wire-like heating element 40, in a region of a disc heater whose center diameter is about ½ of the disc heater, adjacent straight lines of a large number of straight line portions 40b comprising parallel strings divided into ½ are sequentially connected by arc portions 40a or short straight line portions 40'b so that the entire pattern has continuous repeating zigzag shapes. A peripheral region of the center region is divided into two regions in a diametrical direction of the disc heater. In a region closer to the center, each diametrically adjacent pair of ends of a large number of concentrically disposed-long and short various arc portions 40a are connected by the straight line portions 40'b, while in a region closer to the outer periphery, each pair of diametrically adjacent ends of the arc portions 40a on an extensions in a diametrical direction of the connected portions of the ends in the above-described center region are connected by the straight line portions 40'b. Such a complicated topology pattern has been invented for securing thermal uniformity of the heating surface to the utmost.

In FIGS. 19A and 19B, blackened portions indicate burnt portions 40c by heat. It can be understood from distribution of the burnt portions 40c that the burnt portions are concentrated on bent portions of the wire-like heating elements, and many burnt portions 40c exist in portions where closed regions between adjacent wire-like heating elements in which heat is less prone to be released. This is caused because heating current is shortcut in the bent portions and concentrated in inner side of the bent portions. Due to the existence of the burnt portions 40c, the calorific value concentrates in such portions so that the calorific value there is remarkably increased as compared with the other portions, and the object to be processed is locally heated excessively. Further, when the excessively heating state continues, such portions are burnt to cut down wires, so that the heater can not function as a heater.

If the topology pattern is studied in detail, wire-like heating elements disposed in the outermost peripheral region are wider and a distance between the adjacent wires is narrower than the wire-like heating elements in other regions. This is because the heating density of the center of the heater is made rough so that excessive heating in the center can be avoided and the object to be processed can be processed with uniform heat, as in the temperature adjusting heater disclosed in Japanese Patent Laid-open Publication No. 7-183281. However, as described above, according to the latest processing apparatus, high frequency electricity is not always supplied to the center of the heater, or a feeding pipe used for feeding electricity to the heater or static electricity chuck is not always disposed in the center of the heater. Further, when the object to be processed is directly heated, it is required that the entire heating surface of the heater produces heat uniformly.

SUMMARY OF THE INVENTION

The present invention has been accomplished to solve all of these problems, and it is a main object of the present invention to provide a disc heater in which a thin plate surface produces heat uniformly over its entire heating surface, and which has ideal topology pattern whose local excessively heated portion is reduced to the utmost, and to provide a temperature control capable of uniformly heating and cooling an object to be processed.

These objects are effectively achieved by the following first to thirteenth aspects present invention.

According to the first aspect of the present invention, a disc heater is applied to a temperature control apparatus which controls temperature of an object to be processed on at least one surface thereof, in which a wire-like heating element is laid on a plate surface in a predetermined pattern and power feeding portions are disposed at an end of the wire-like heating element, wherein the pattern formed by the wire-like heating element includes a large number of arc portions disposed on a large number of concentric circles, and a surface area of the arc portions is 70% or greater of a surface area of the entire pattern.

In the pattern formed by the wire-like heating element, folded portions, which are folded back at acute angles, are prone to be excessively heated. Thereupon, in the present invention, 70% or more of the pattern of the wire-like heating element is constituted by the large number of arc portions disposed on the large number of concentric circles. Therefore, the local excessively heated portions are reduced, so that burning and disconnection due to such excessive heating can be avoided, thus improving the durability. Further, since the arc portions on circumferences of adjacent concentric circles are connected to each other by slight straight lines while being appropriately dispersed on the same circumferences, it is easy to uniform the heat. Further, it is preferable that the portions folded at acute angles are connected with small arcs so as to reduce the burning. Or when a plurality of slits are formed along the folded shapes in the folded portions, electric current uniformly flows through a portion of the wire-like heating element sandwiching the slits, so that the local excessively heated portions are not generated and burning is not generated.

According to a second aspect of the present invention, the surface area of the arc portions with respect to the surface area of the entire pattern is preferably in a range of 85 to 95% in view of thermal uniformity.

According to a third aspect of the present invention, the pattern formed by the wire-like heating element further includes connecting portions sequentially connecting one end of each of the arc portions disposed concentrically with one end of each of the arc portions toward a center. With this connection, the connecting portions can be set short to the utmost, so that the folded portions can be formed about at 90° which is the limit folding angle not to be excessively heated. Therefore, the excessively heated portions can be reduced.

According to a fourth aspect of the present invention, the connecting portions are preferably disposed so as to be dispersed in different diametric regions on the concentric circles. However, the connecting portions may not only be disposed such as to be dispersed in different diametric region on the concentric circles, but also be disposed in parallel to the same diametric regions on the concentric circles. In general, it is preferable that the connecting portions are dispersed in the different diametric regions on the concentric circles because a connecting portion is prone to be heated excessively. However, even when they are disposed in parallel to the same diametric regions on the concentric circles, as far as the feature of the first aspect of the present invention is satisfied, there is no disadvantage as compared with a conventional topology pattern of this kind.

According to a fifth aspect of the present invention, the pattern of the third aspect may be combined with arc portions on concentric circles having another concentric center which is different from that of the concentric circles according to the third aspect. With this structure, especially in the pattern of the center, the portions folded at acute angles can be reduced, and lengths of the wire-like heating elements in each pattern connected in parallel can be uniformed.

According to a sixth aspect of the present invention, a surface area of each wire-like heating element per unit length is substantially equal in its longitudinal direction, and the wire-like heating element constituting the pattern is disposed at the same intervals from one another. That is, the calorific value of the wire-like heating element becomes uniform in the longitudinal direction, and the distances between the wire-like heating elements are the same, so that the thermal uniformity on the heating surface of the heater can be secured.

According to a seventh aspect of the present invention, the wire-like heating elements are in plural and connected to the power feeding portions in parallel. By connecting the plurality of wire-like heating elements to the power feeding portion in parallel, influence of burning and damage due to excessive heating or the other reason is suppressed to the minimum.

According to an eighth aspect of the present invention, the entire surface area of the wire-like heating element is 45% or greater than an area of a region of the plate disc where the wire-like heating element is disposed. By setting the entire surface area of the wire-like heating element at 45% or greater than a region in which the wire-like heating element of the disc plate is disposed, the object to be processed can be sufficiently heated, and the thermal uniformity is easily secured.

According to a ninth aspect of the present invention, the wire-like heating element is formed on a disc insulative resin film body in a predetermined pattern via a metal thin film, a power-feeding-portion-forming region comprising an insulative resin film is integrally extended from a portion of a peripheral edge of the disc insulative resin film body with predetermined width and length, the power feeding portion is formed over substantially an entire surface of the power-feeding-portion-forming region, an end edge of the power feeding portion at a side of the wire-like heating element is formed so as to extend to an inner side of the insulative resin film body beyond its peripheral edge, and a slit-like power-feeding-portion-non-forming region extending along a current path is formed at an intermediate portion of the end edge.

A disc heater having such a structure is used such that the heater is fixed on a thin disc made of aluminum for example via a welding sheet by welding, but at the time of welding, the heater is positioned and temporarily fixed on the thin disc or external force is applied to the insulative film after welding in many cases. If the end edge of the power feeding portion at the side of the wire-like heating element formed in the power-feeding-portion-forming region with a predetermined width in the circumferential direction is disposed outer side of the outer periphery of the disc insulative resin film body, and the wire-like heating element is connected to a portion of the end edge of the power feeding portion with an acute angle, when any external force is applied to the connected portion, it is prone to be cut by the outer peripheral edge of the aluminum thin disc, and the heater function is lost by a break.

Thereupon, in the present invention, the end edge of the power feeding portion at the side of the wire-like heating element is formed so as to extend to the inner side of the insulative resin film body beyond its peripheral edge, thereby preventing the break of the power feeding portion.

Further, in order to weld the disc heater to the aluminum thin disc via a welding sheet, they are welded under high temperature of about 200 to 300° C. On the other hand, since constituting materials of the insulative resin film, the metal thin film such as stainless and the power feeding portion have different coefficients of thermal linear expansion, a portion of the power feeding portion formed over substantially the entire region of the power-feeding-portion-forming region having predetermined width and length floats up at the time of welding because of the difference in coefficient of thermal linear expansion. Therefore, wrinkle is generated, and not only the outer appearance but also functions are influenced.

In the present invention, the wrinkle is prevented by forming the slit-like power-feeding-portion-non-forming region extending along the current path in the intermediate portion of the end edge of the power feeding portion at the side of the wire-like heating element.

According to a tenth aspect of the present invention, the disc heater has around its outer periphery one or more auxiliary heater portions in which the wire-like heating element different from the heater for uniforming thermal distribution of the disc heater is laid.

For example, the auxiliary heater portion is formed into a ring-shape over the entire periphery of the disc heater. In the disc heater. Due to differences in calorific value and heat releasing value between the center portion and the peripheral portion of the disc heater, temperature gradient occurs such that the temperature of the center portion rises and the temperature of the periphery is lowered. However, by forming the auxiliary heater portion around the entire periphery of the disc heater, the temperature variation between the center portion which essentially heats and cools the object to be processed and the peripheral portion of the disc heater is reduced, so that the thermal uniformity over the entire surface of the disc heater is further enhanced.

According to an eleventh aspect of the present invention, further to the tenth aspect, the auxiliary heater portions are formed such that a gap is remained on a portion of the entire outer periphery of the disc heater, and the power feeding portion of the disc heater is connected to an end of the wire-like heating element of the disc heater through the gap of the auxiliary heater portion. Here, the gap means a region in which the wire-like heating element is not laid.

By passing the power feeding portion of the disc heater through the gap, it is possible to feed electricity to the disc heater which is surrounded by the auxiliary heaters. Therefore, it is unnecessary to lay a wire-like body for feeding power in the lower portion of the heater, and the thermal uniformity is further enhanced. Further, since the disc heater, the auxiliary heater portions and the power feeding portions can be formed on the same plane, the front and back surfaces of the disc heater can be formed into smooth flat surfaces. It is preferable that the power feeding portions of the disc heater and the auxiliary heater portions are located closely to each other because the feeding wires can be disposed in one place.

Alternatively, according to a twelfth aspect of the invention, the auxiliary heater portion may be formed over substantially an entire periphery of the disc heater, the power feeding portion of the disc heater is disposed on either front or back side of the auxiliary heater portion via an insulative layer, and is connected to one end of the wire-like heating element of the disc heater. In the eleventh aspect of the present invention, since the gap in which the wire-like heating element is not formed is provided in the auxiliary heater portions, it can not be denied that the thermal uniformity may be slightly deteriorated in the gap portion. However, in the twelfth aspect of the present invention, the power feeding portion of the disc heater can be disposed on the outer peripheral portion without forming the gap in the auxiliary heater portion, so that higher thermal uniformity can be achieved. Since the power feeding portion is not heated even though it is energized, even though the power feeding portion is disposed on either front and back side, the heating of the auxiliary heater portion is not influenced.

According to a thirteenth aspect of the present invention, there is provided a temperature control apparatus in which a disc heater on which a wire-like heating element is laid in a predetermined pattern is disposed on at least one surface for controlling a temperature of an object to be processed on the surface, wherein the pattern formed by the wire-like heating element of the disc heater include a large number of arc portions disposed on a large number of concentric circles, and a surface area of the arc portions is 70% or greater of a surface area of the entire pattern, and a heating/cooling portion by heating/cooling fluid is provided on a front and/or back surface of the disc heater.

In the temperature control apparatus, by energizing the wire-like heating element of the disc heater, the wire-like heating element is heated and the object to be processed placed on its surface is heated. At that time, since the wire-like heating element is laid on the disc heater in the above described pattern, so that the entire surface is uniformly heated, the entire object to be processed is uniformly heated. When the electric supply to the wire-like heating element is stopped, and the cooling fluid is introduced to the heating/cooling portion, the object to be processed placed on the surface is swiftly cooled. When the temperature during the cooling process must be controlled precisely, it is also possible to finely adjust the cooling temperature by energizing the wire-like heating element of the disc heater at the time of cooling operation of the heating/cooling portion. Further, it is also possible to finely adjust the heating operation by the disc heater by introducing the heating fluid to the heating/cooling portion. The heating/cooling portion can be provided with a valve for selectively introducing the heating fluid and the cooling fluid, so that the heating/cooling portion can be provided with both heating and cooling functions or either one of the heating and cooling functions.

DETAILED DESCRIPTION OF THE PREFERRED EMBODIMENTS

In order to remove a solvent remaining on an applied resist film, a general semiconductor manufacturing process includes a heating step such as bake for heating a substrate, and a cooling step such as cooling for cooling the heated substrate to a room temperature level. As a temperature control apparatus used in the manufacturing process of the semiconductor, there is an apparatus disclosed in Japanese Patent Application No. 10-40765 previously proposed by the present inventor.

Figure 1:
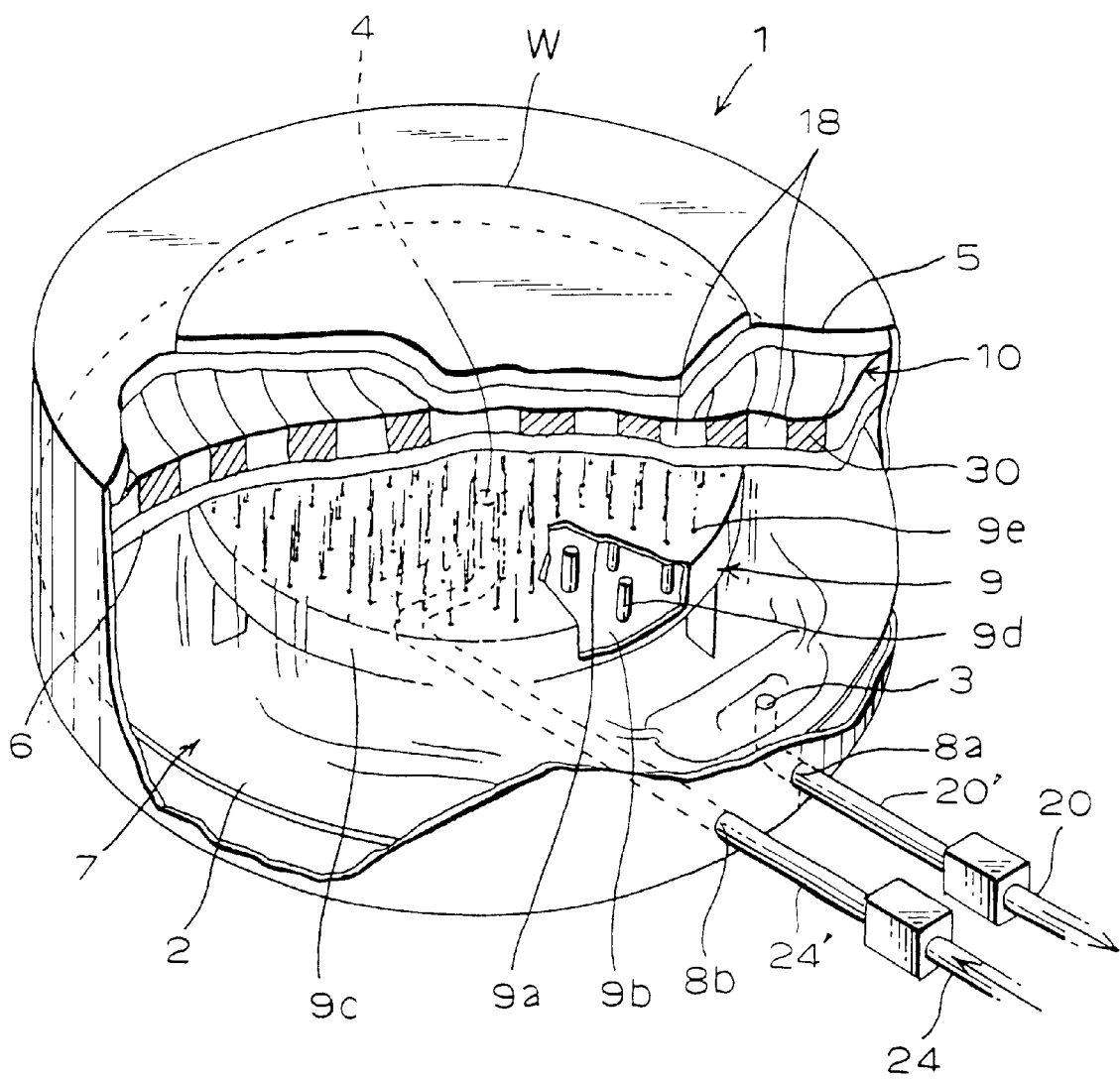
FIG. 1 is a partly broken perspective view showing an embodiment of a temperature control apparatus for heating and cooling a semiconductor wafer to which a disc heater of the present invention is applied.

FIG. 1 schematically shows a temperature control apparatus. This temperature control apparatus is disposed in a unitary processing chamber (not shown). In the illustrated example, the temperature control apparatus 1 comprises a hollow cylindrical closed container, in which a disc heater 10 of the present invention is disposed on a placing surface for an object to be processed, and a supplying/discharging space 7 for cooling fluid is formed in the apparatus. More specifically, a discharging port 3 for the cooling fluid is formed at a peripheral portion of a bottom wall of the apparatus, and a discharging pipe 20' is connected to the discharging port 3. Further, a supplying pipe 24' for the cooling fluid passes through a center portion of the bottom wall, and an introducing port 4 for the cooling fluid is opened at the supplying/discharging space.

Figure 2:
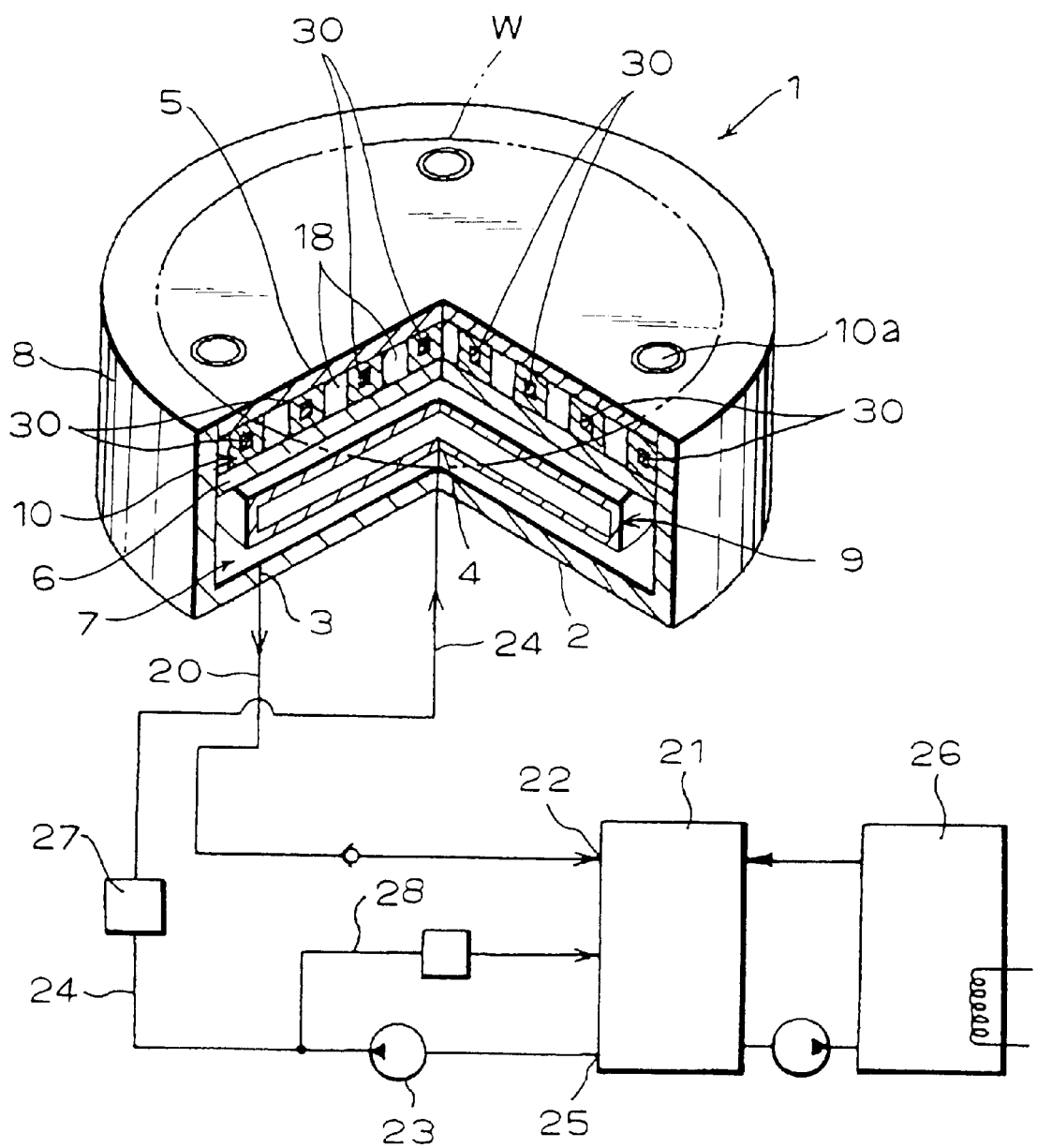
FIG. 2 is a schematic circuit diagram showing an example of a control circuit of the temperature control apparatus.

FIG. 2 shows the temperature control apparatus 1 and a circuit for cooling fluid. The discharging port 3 passes through the discharging pipe 20' and a discharge passage 20 and is connected to a returning inlet port 22 of a heat storage tank 21. On the other hand, the introducing port 4 passes through a common supply passage 24 provided with a supply pump 23 and the supplying pipe 24' and is connected to a discharging port 25 of the heat storage tank 21. Stored in the heat storage tank 21 is temperature fluid, more specifically, liquid such as of fluorocarbon liquid, ethylene glycol, oil and water, or gas such as nitrogen, air and helium, which is to be appropriately selected in accordance with a target temperature to be controlled, and by circulating this temperature fluid between the heat storage tank 21 and a tiller tank 26, a temperature of the temperature fluid is adjusted and maintained at about 20° C. Reference numeral 27 in the drawing represents an on-off valve interposed between the supply passages 24.

The disc heater 10 is integrally formed with an insulator resin 18 such as polyimide, and upper and lower surfaces thereof are sandwiched and fixed by disc thin plates 5 and 6 each of which is about 0.5 mm and made of material having high thermal conductivity such as aluminum, aluminum alloy or alumina. The disc heater 10 includes wire-like heating elements 30 disposed and fixed between the disc thin plates 5 and 6 via the insulator resin 18 in a predetermined topology pattern. Each of the wire-like heating elements 30 is formed in one stroke drawing manner. The wire-like heating elements 30 in the illustrated example are made of metal or alloy having high electrical resistance per unit length such as nickel-chromium alloy and iron-chromium alloy. An outer periphery of each wire-like heating element is covered with the insulator resin 18 such as polyimide. Consequently, there is formed a topology pattern which is peculiar to the present invention and will be described later and in which its heat producing region assumes equally heat producing density.

In the supplying/discharging space 7 between the lower disc thin plate 6 and the bottom wall 2, a porous uniform member or a cooling fluid dispersing member 9 such as a large number of tube-like fins is disposed. In the example shown in FIG. 1, the cooling fluid dispersing member 9 comprises a hollow cylindrical body including a ceiling 9a, a bottom 9b and a peripheral wall 9c, and a large number of pins 9d are disposed between the ceiling 9a and the bottom 9b. The hollow cylindrical body is made of the same material as those of the disc thin plates 5 and 6, and the introducing port 4 is opened at the bottom 9b. Further, a large number of cooling fluid ejection ports 9e are opened at the ceiling 9a, and by the cooling fluid ejected from the cooling fluid ejection ports 9e, the cooling fluid is brought into uniform contact with the disc thin plate 6.

Each of peripheral edges of the disc heater 10, the bottom wall 2 and the upper and lower disc thin plates 5 and 6 is hermetically closed by a side wall 8 made of the same material. A portion of the side wall 8 closer to the bottom wall 2 includes insertion openings 8a and 8b for the cooling fluid discharging pipe 20' connecting the cooling fluid discharging port 3 and the heat storage tank 21 and for the supplying pipe 24' connecting the cooling fluid introducing port 4 and the supply pump 23, respectively.

In the temperature control apparatus 1 having the above-described structure, a predetermined heating electricity is supplied to the wire-like heating elements 30 in a state in which a wafer W to which a resist is applied is placed on an upper surface of the disc heater 10, so that the wire-like heating elements 30 are heated, and a heat amount generated from the wire-like heating elements 30 is transmitted to the wafer W through the upper disc thin plate 5. Then, the wafer W is swiftly heated to a predetermined temperature, and the heating is maintained. When this heating process is completed, the above-described supply of the heating electricity is stopped, the on-off valve 27 is turned ON. Then, the cooling fluid of about 20° C. stored in the storage tank 21 is circulated and supplied to the supplying/discharging space 7 of the temperature control apparatus 1 through the supply passage 24, the cooling fluid dispersion member 9 and the discharge passage 20. Consequently, the heat of the wafer W is released to the cooling fluid through the upper disc thin plate 5, the wire-like heating elements 30 and the lower disc thin plate 6, so that the wafer W is swiftly cooled to a temperature of 20° C. and the temperature is maintained, thus the wafer W is cooled.

When the temperature control apparatus 1 is employed in this manner, a heating step and a cooling step for the object to be processed can be carried out at the same position, so that it is possible to save space and remarkably enhance the operation efficiency. When the cooling temperature of the wafer W must be controlled precisely, it is possible to supply the electricity to the wire-like heating elements 30 of the disc heater 10 also at the time of cooling by the cooling fluid, and to finely adjust the cooling temperature by the disc heater 10.

The temperature control apparatus 1 as exemplified here is used for pre-baking+cooling or post-baking+cooling in the semiconductor manufacturing process. Therefore, the temperature control apparatus 1 carries out a control for repeating a cycle in which the wafer W which is an object to be processed is first heated (baking) and then, the wafer W is cooled (cooling) to a room temperature in some tens seconds intervals per one wafer.

In general, the above-described heater 10 is formed with the wire-like heating elements 30 laid in a single layer. Both front and back surfaces of the thermal resistance wire bodies are covered with insulator resin such as polyimide. The wire-like heating elements 30 are adhered to an upper surface of the plate by an adhering means such as weld sheet or are directly formed on an upper surface of the lower disc thin plate 6 by thermal spraying or electrodeposition. In order to realize uniform thermal treatment with respect to the object to be processed and to avoid burning of the wire-like heating elements 30, it is preferable that the wire-like heating elements 30 are made of metal or alloy that has high electrical resistance per unit length such as nickel-chromium alloy or iron-chromium alloy, so that the heating density over the entire region of the wire-like heating elements 30 becomes uniform, and the wire-like heating elements 30 are laid in a topology pattern in which local excessively heated portion is not generated.

From the above explanation, it will be understood that the topology pattern of the wire-like heating elements 30 is one of the most important elements for uniforming the temperature distribution when the object to be processed is heated, and for enhancing the durability of the disc heater 10. The present inventor developed an ideal topology pattern of the wire-like heating elements 30 in view of this fact.

Figure 3:
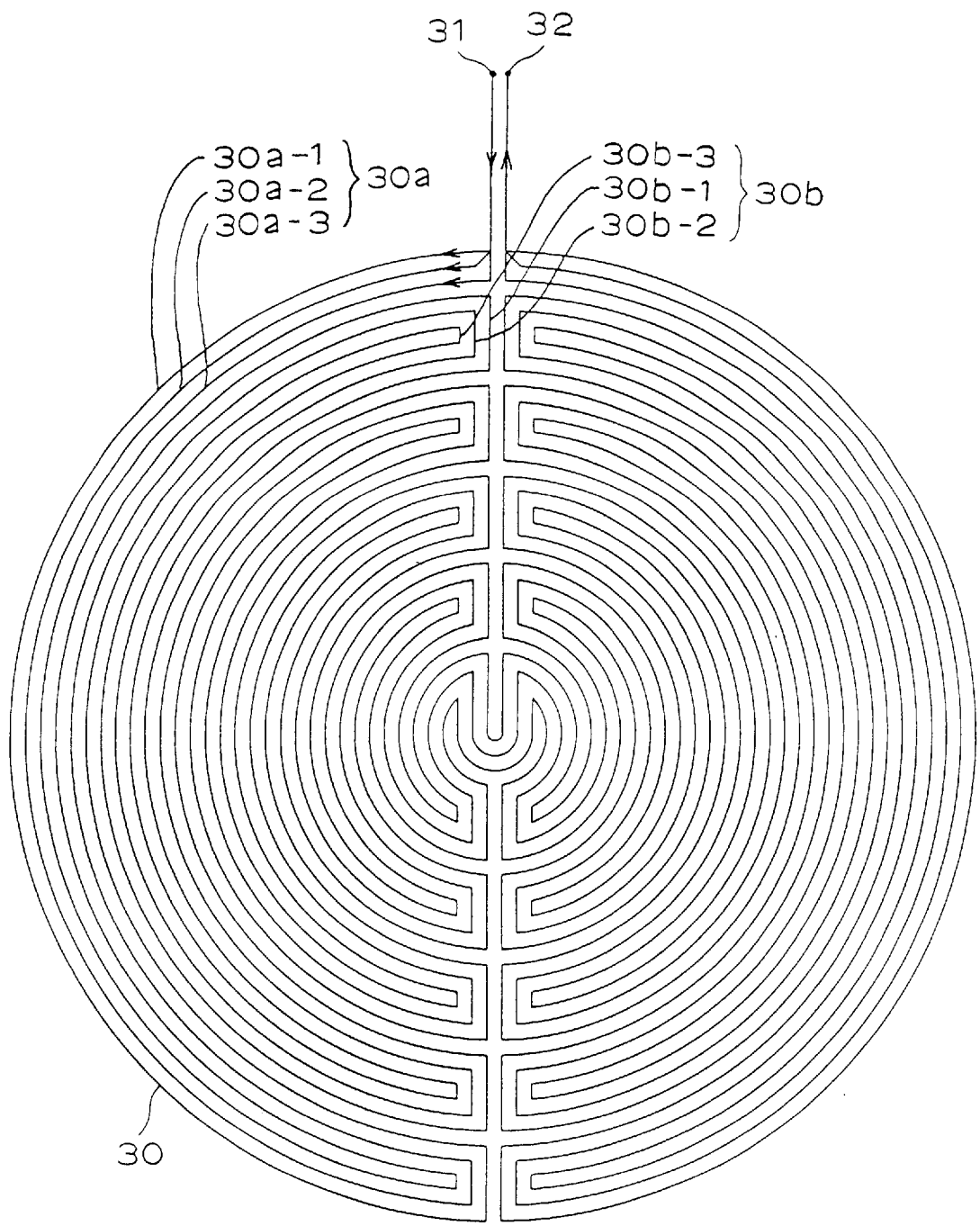
FIG. 3 is a plan view of a topology pattern showing wire-like heating elements in the disc heater according to a typical embodiment of the invention.

FIG. 3 shows a typical topology pattern of the wire-like heating elements 30. According to this topology pattern, one side ends of circuits of three wire-like heating elements 30 (30-1 to 30-3) and the other side ends of the circuits are connected, in parallel, to one power feeding portion 31 and the other power feeding portion 32 disposed adjacent each other at the same position, respectively. The one side ends of the three wire-like heating elements 30 (30-1 to 30-3) are connected to the single power feeding portion 31, and the three wires as one set are disposed so as to extend in arc on three concentric semicircles. At their folded portions, each of the wire-like heating elements 30 is folded in parallel to each other in the same diametric direction, and the wire-like bodies further extend into arc shape on the inner three concentric semicircles. Then, at the folded portions, the wire-like heating elements 30 (30-1 to 30-3) are folded in parallel to each other in the same diametric direction again. This is repeated and then, three wire-like bodies extend in arc shapes as one set on three semicircles closer to the center opposite from the above-described semicircles, and at the folded portions, the wire-like heating elements 30 are folded in parallel each other in the same diametric direction. While this is repeated sequentially toward the outer diameter side, an output terminal of each of the three wire-like heating elements 30 (30-1 to 30-3) is connected to the other single power feeding portion 32.

Portions forming arcs of the wire-like heating elements 30 (30-1 to 30-3) are arc portions 30a (30a-1 to 30a-3) of the present invention, and the folded portions are connecting portions 30b (30b-1 to 30b-3) of the present invention. By employing such topology pattern of wire-like heating elements 30, an area occupied by the arc portions 30a (30a-1 to 30a-3) can be largely increased than the connecting portions 30b (30b-1 to 30b-3) as compared with the conventional topology pattern of this type.

Figure 17:
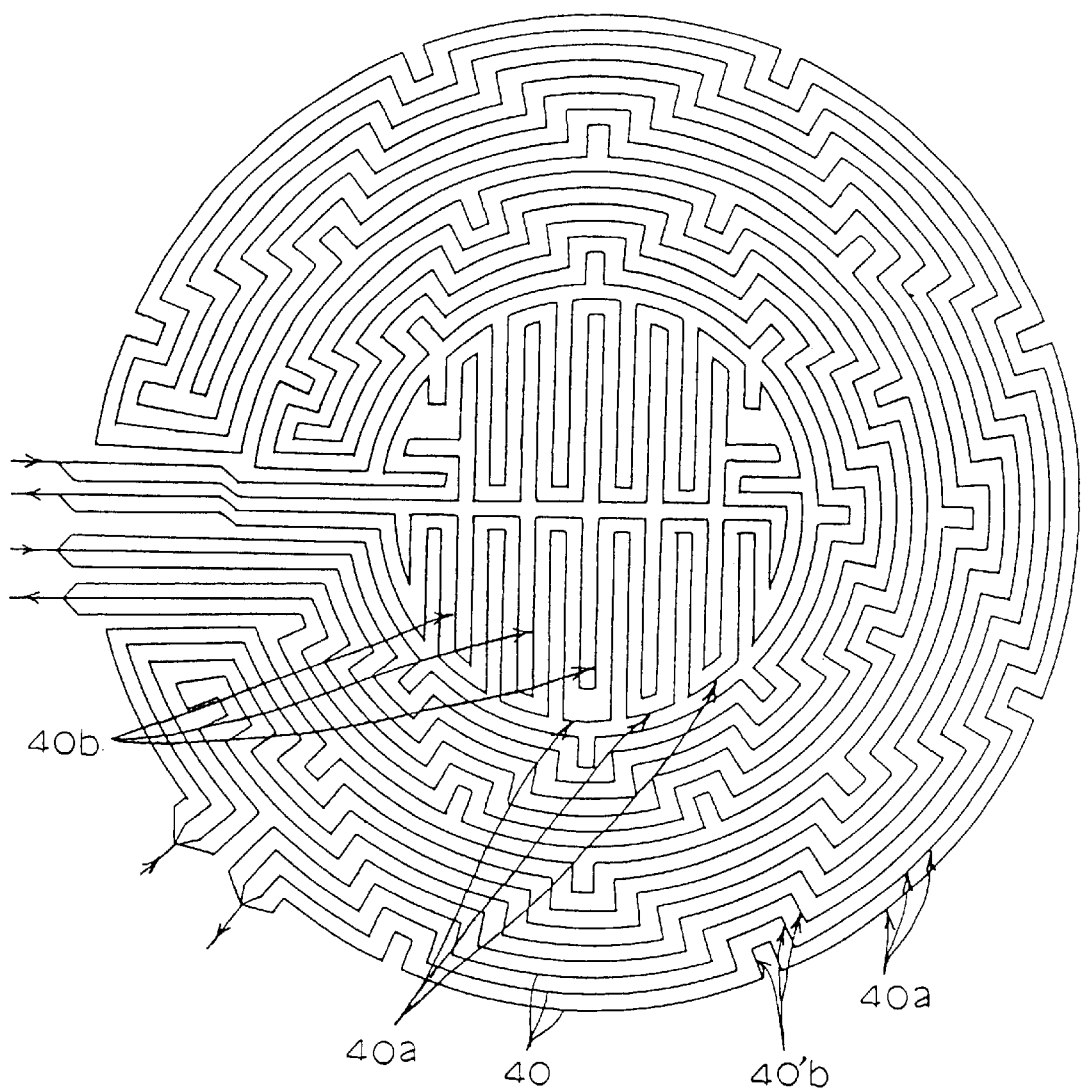
FIG. 17 is a plan view showing a topology pattern of the wire-like heating elements in a conventional disc heater.
Figure 18:
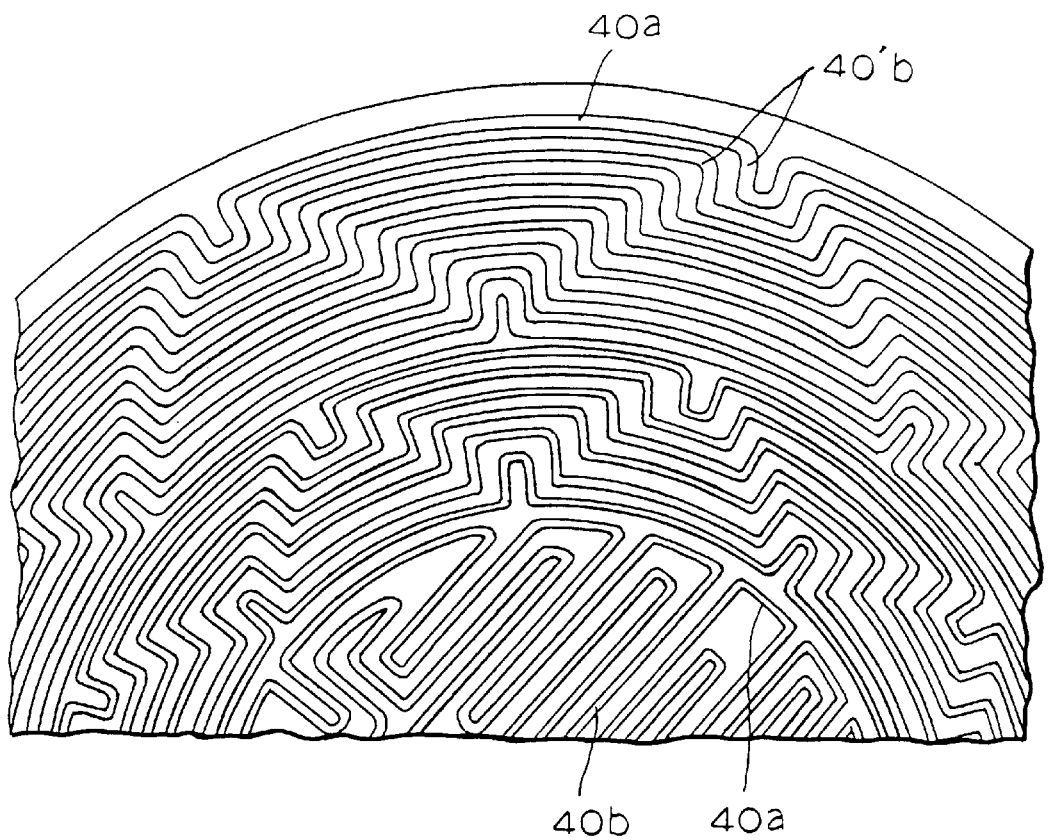
FIG. 18 is a partially enlarged view of FIG. 17.
Figure 19A:
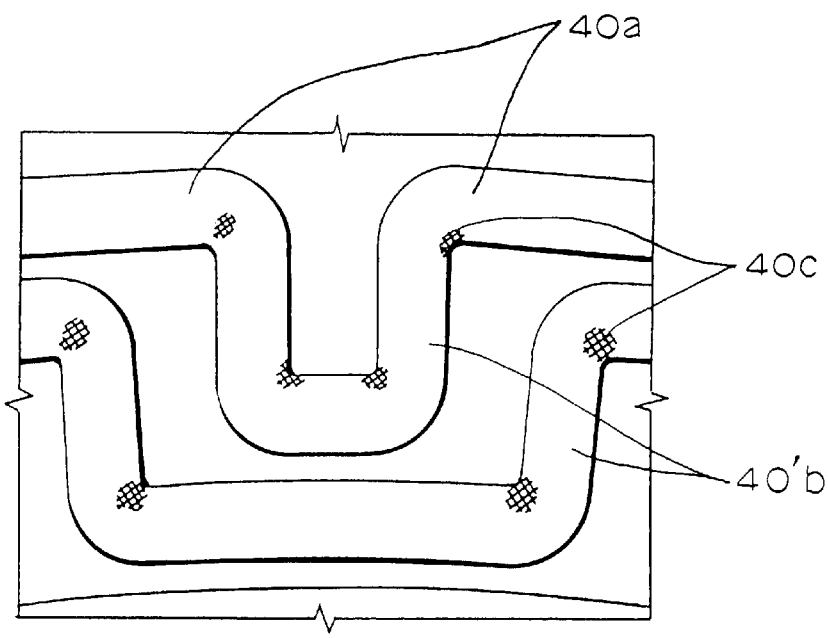
FIGS. 19A and 19B are partially enlarged views of FIG. 18.
Figure 19B:
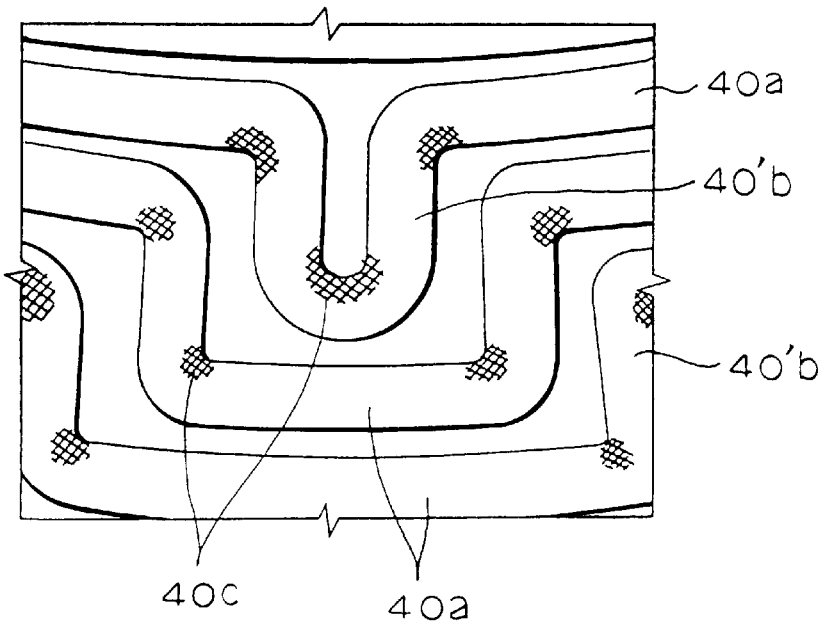

As described above, the arc portion 30a is less prone to be heated excessively, while most of the bent portions of the connecting portions 30b are prone to be heated excessively. Especially, when the connecting portion 30b is bent at an acute angle, an inner side of the bent portion is prone to be heated excessively as apparent from FIGS. 17 to 19. According to the present invention, the area occupied by the arc portions 30a (30a-1 to 30a-3) can be largely increased than the connecting portions 30b (30b-1 to 30b-3), and portions which are bent at acute angles can be reduced. Therefore, it is possible to extremely reduce the excessively heated portions.

Further, according to the present invention, when each bent portion which is bent at an acute angle is formed with an arc (R) or the wire-like heating element 30 is formed with some slits along the bent shape, the current uniformly or dispersively flows through the bent portion and thus, the bent portions are not excessively heated and any burning is prevented from being generated. Further, as can be understood also from FIG. 3, by making areas of surfaces of the wire-like heating elements 30 per length uniform and making distances between the wires uniform, uniform calorific value can be obtained over the entire heating surface of the disc heater 10.

Further, in the temperature control apparatus 1, when the semiconductor wafer W which is an object to be processed is directly heated and cooled through the upper thin plate 5 by the disc heater 10 having the wire-like heating elements 30 comprising such a topology pattern, the heat can be swiftly transmitted when the wire-like heating elements 30 are heated or such heating treatment is stopped, so that ideal heating and cooling treatments can be carried out.

Figure 4:
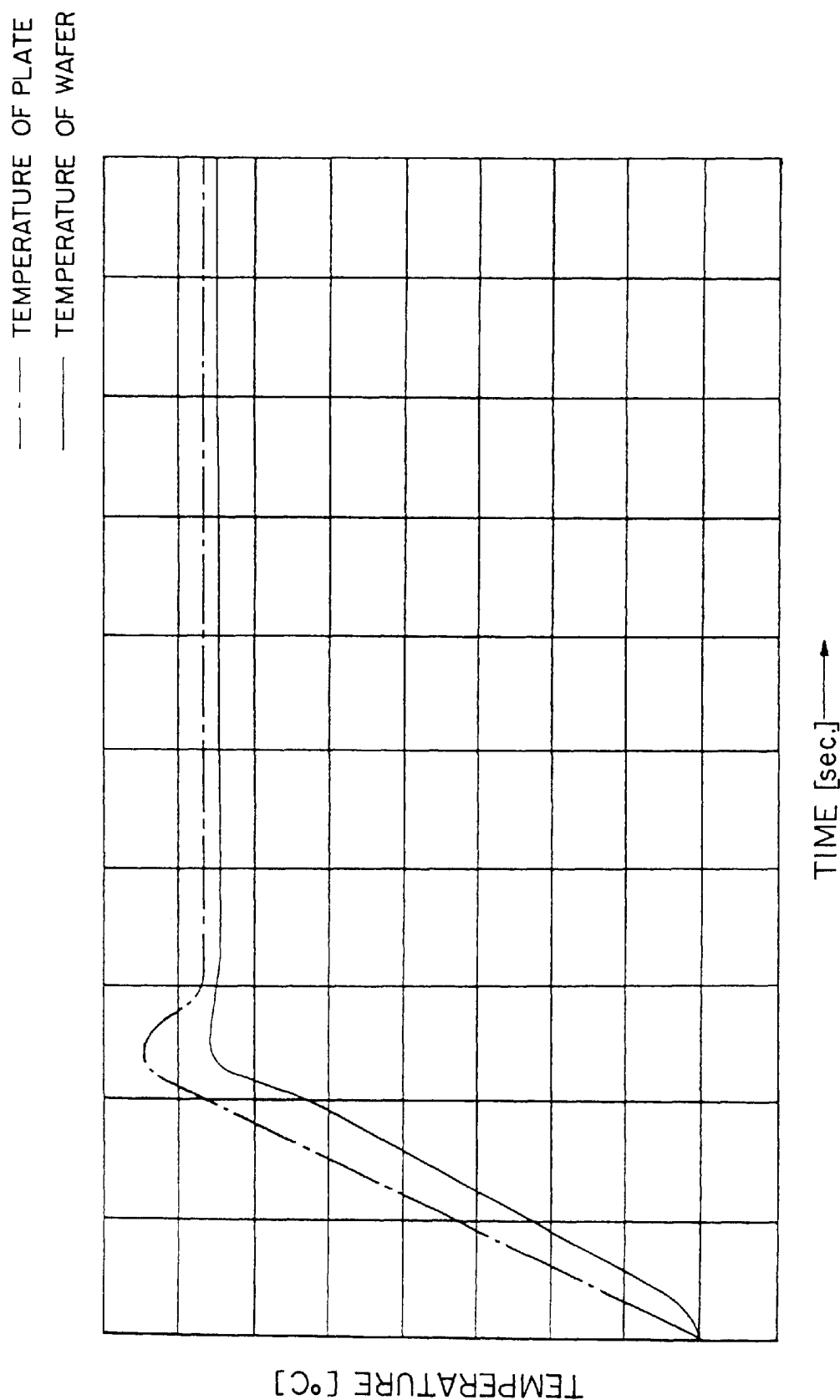
FIG. 4 is a diagram showing a variation in temperature of an upper thin plate of the disc heater and a variation in temperature of a wafer within a corresponding time period.

FIG. 4 shows a variation in temperature of the upper thin plate 5 of the temperature control apparatus 1 and a variation in temperature of the wafer W within the corresponding time period. The upper thin plate 5 is controlled such that its temperature swiftly rises by the supply of heating electricity, and the temperature is once overshoot and then, a predetermined set temperature is maintained. At that time, temperature of the wafer W also rises swiftly to a desired treating temperature within substantially the same time period. Substantially at the same time as the upper thin plate 5 is maintained at a predetermined temperature, the wafer W is also maintained at a stable treating temperature. This means that because of the above-described structure of the disc heater 10 of the present embodiment, the heat is swiftly transmitted or released. Thus, even for the cooling treatment for example, when the supply of the heating power is stopped, the temperature can be lowered to a desired cooling temperature swiftly. It will be understood that ideal control can be carried out for a temperature control of the above-described type without employing another special structure.

In the topology pattern of the wire-like heating elements 30, it is preferable that a gross area of the arc portions 30a is 70%, more preferably, 85 to 95% of the area of the wire-like heating elements 30, in view of heating efficiency of the object to be processed. When the gross area is lower than 70%, the entire thermal uniformity is lowered. Further, when the area of the wire-like heating elements 30 of the above-described topology pattern is 45% or greater of the gross area of the heating surface, heating density on the pattern is suppressed to a low value, so that the thermal uniformity is secured, and the above-described effective temperature control becomes possible.

Figure 5:
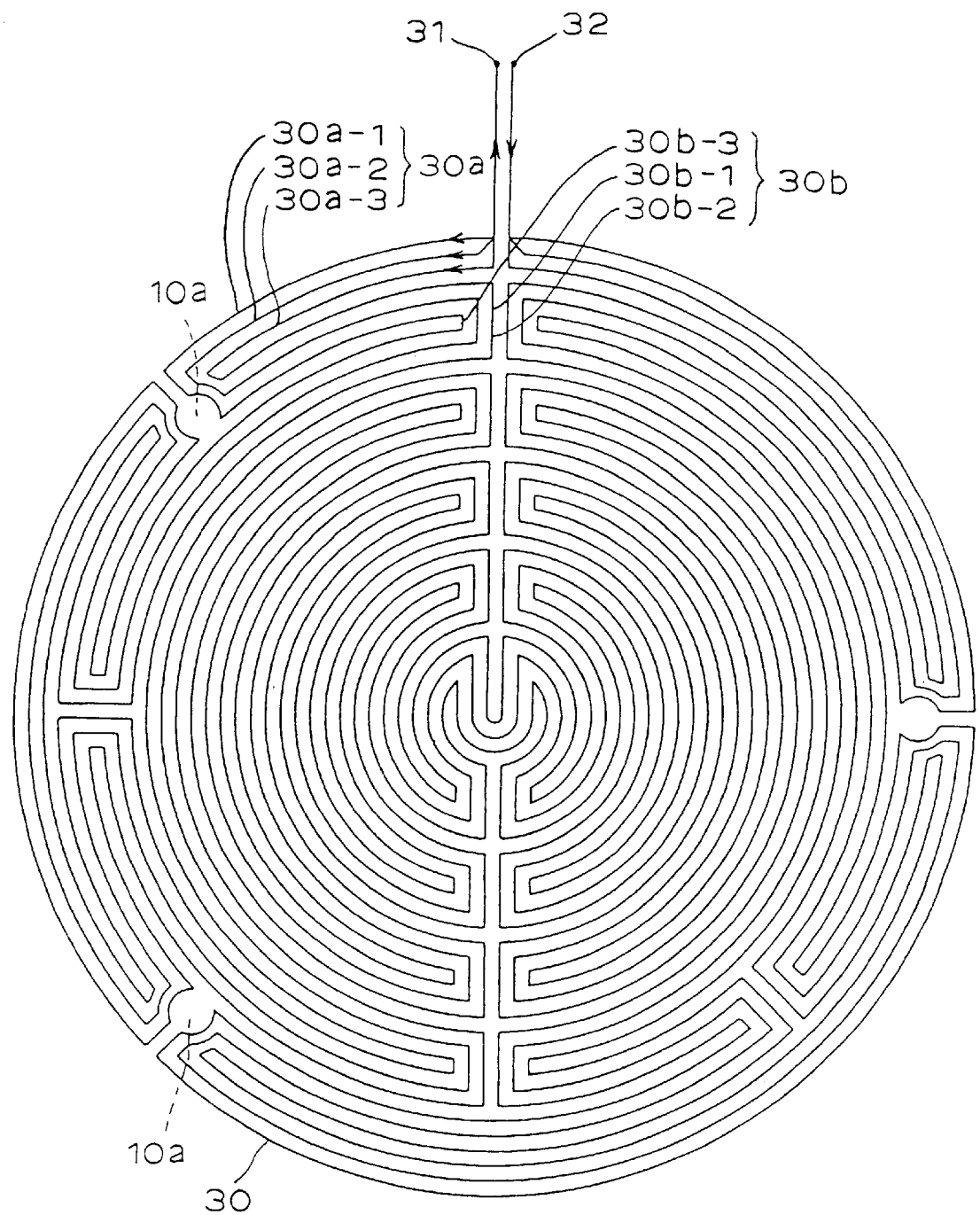
FIG. 5 is a plan view of a topology pattern of wire-like heating elements as a first modification of the above-mentioned embodiment.

FIGS. 5 to 10 show examples of other topology patterns of the wire-like heating elements 30 in the disc heater 10 according to the present invention, which are suitable for the above-described temperature control apparatus 1. An example of the topology pattern as shown in FIG. 5, the pattern is formed in the disc heater 10 as shown in FIG. 2, but includes through holes 10a for susceptor pins which support the object to be processed from below and rises and lowers the object and which will be described later. In the illustrated example, some of the connecting portions 30b connecting the arc portions (30a-1 to 30a-3) to each other are disposed on the same circumference region as the through holes 10a.

Figure 6:
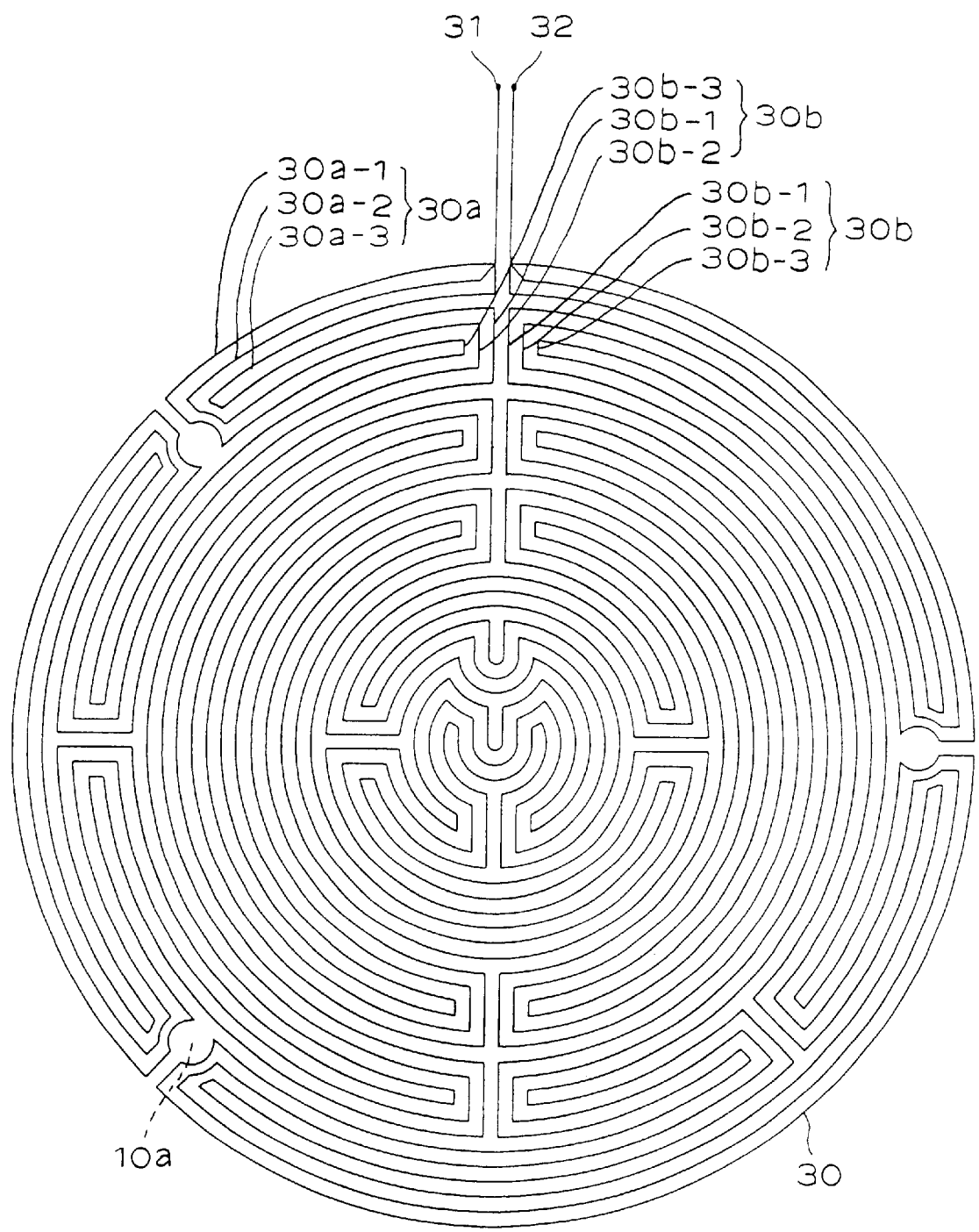
FIG. 6 is a plan view of a topology pattern of wire-like heating elements as a second modification of the above-mentioned embodiment.

FIG. 6 shows an example in which the connecting portions 30b (30b-1 to 30b-3) connecting arc portions (30a-1 to 30a-3) to each other are not disposed on the same diametric regions of the concentric circles, but some of them are positively disposed on different diametric regions. In the topology pattern shown in FIG. 6, in order to avoid acute connection as in the connecting portions on a center of the topology pattern in FIG. 5, the connecting portions 30b are dispersed to connect the two arc portions having centers at different positions, and each of the connections is close to 90°.

Figure 7:
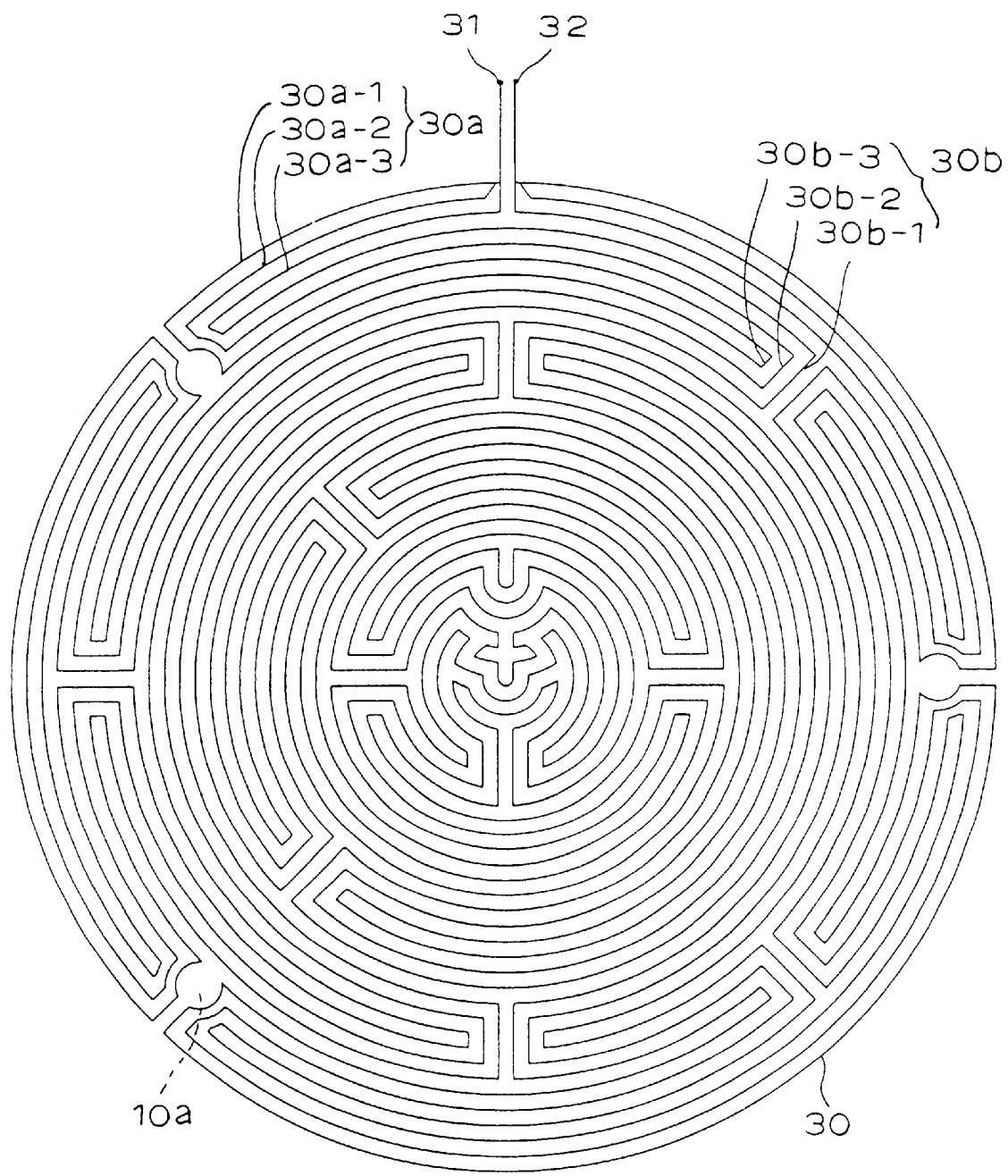
FIG. 7 is a plan view of a topology pattern of wire-like heating elements as a third modification of the above-mentioned embodiment.

In an example of topology pattern shown in FIG. 7, the connecting portions 30b (30b-1 to 30b-3) connecting the arc portions 30a (30a-1 to 30a-3) to each other are not disposed on the same diametric region of the concentric circles, but are disposed on different diametric regions of the concentric circles, and the topology pattern at the center is adjusted such that overall lengths of the three wire-like heating elements 30 that are in parallel and connected become equal to one another.

As can be understood also from FIGS. 5 to 7, in the heating and cooling treatment of the wafer W of this kind, the wafer W is transferred in and out from a processing chamber by a robot. That is, the wafer W which is the object to be processed is transferred into the processing chamber by the robot, and is positioned above the temperature control apparatus placed in the chamber. Next, three susceptor pins (not shown) passing through the disc heater 10 of the temperature control apparatus 1 project upward from the upper thin plate 5, support the transferred and positioned wafer W at three points. Then, the susceptor pins retreat into the temperature control apparatus 1, and place the wafer W on the surface of the upper thin plate 5. When the processing is completed, the susceptor pins again project upward from the upper thin plate 5, support the processed wafer W at three points and lift it up the same. The robot receives and grasps the lifted wafer W and transfers it out from the processing chamber.

The three susceptor pins are disposed on the same circumference in the temperature control apparatus 1 with phase difference of 120° from one another. Therefore, in the disc heater 10 of this kind, the through holes 10a are formed at projecting and retreating positions of the susceptor pins as shown in FIGS. 5 to 7, and normally, the wire-like heating elements 30 are disposed such as to surround the pin through holes 10a.

Figure 8:
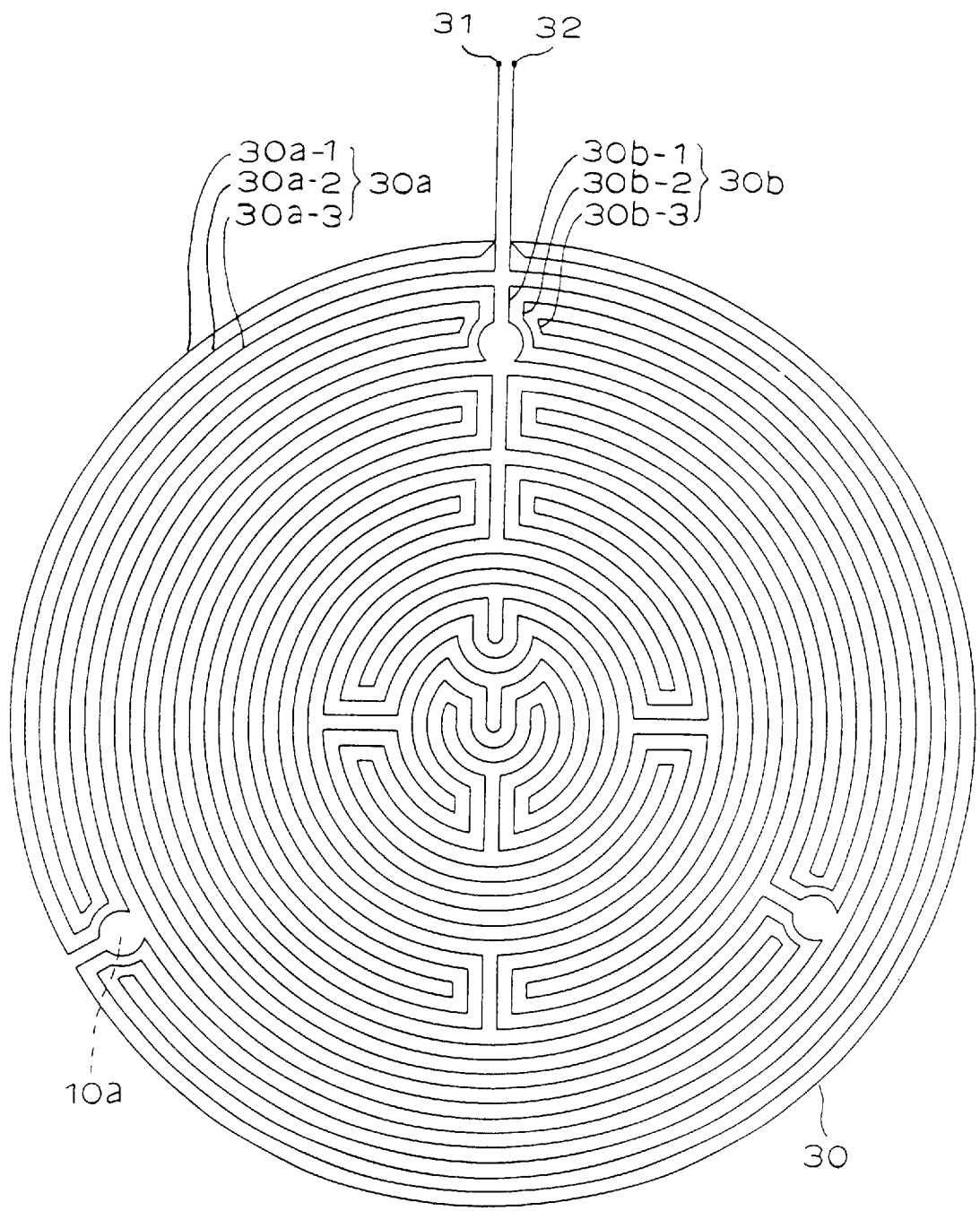
FIG. 8 is a plan view of a topology pattern of wire-like heating elements as a fourth modification of the above-mentioned embodiment.

In a modification shown in FIG. 8, the through holes 10a of the susceptor pins are formed on concentric circles with phase difference of 120° from one another at different positions on the circumference. With this structure, the wire-like heating elements 30 whose thermal densities are prone to be high at peripheries of the pin through holes 10a are dispersed in the diametric direction also, so that the thermal uniformity on the entire heating surface is enhanced, the heat is swiftly transmitted in the periphery of the pin through hole 10a, so that it is possible to reduce the damage of the wire-like heating elements 30 due to burning.

Figure 9:
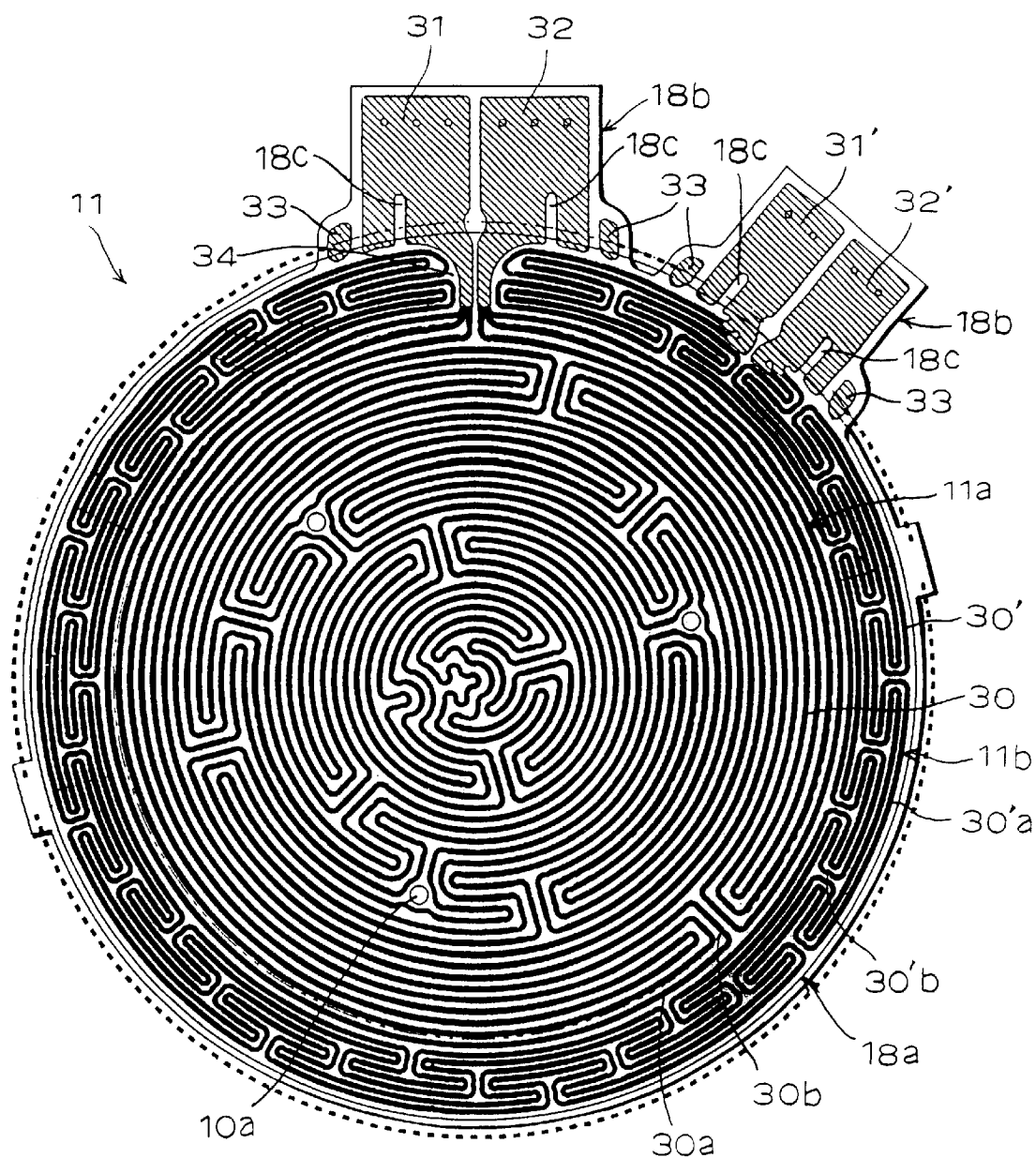
FIG. 9 is a plan view of a disc heater according to another embodiment of the invention.

FIG. 9 shows a disc heater 11 in another embodiment of the present invention applied to the temperature control apparatus shown in FIG. 1. In this example, the topology pattern is formed using two sets of wire-like heating elements 30 and 30'. That is, in one of sets, three wire-like heating elements 30 are connected to one set of power feeding portions 31 and 32 in parallel, and in the other set, two wire-like heating elements 30' are connected to the other set of power feeding portions 31' and 32' in parallel. The three wire-like heating elements 30 form a topology pattern of the disc heater portion 11a in a center region of the disc heater 11, and the two wire-like heating elements 30' form an auxiliary heater portion 11b in a portion of the entire outer periphery of the disc heater portion 11a except a region (gap) 34 where the wire-like heating elements 30' are not laid. In the topology patterns of the wire-like heating elements 30 and 30', the arc portions 30a and 30'a and their connecting portions 30b and 30'b uniform the calorific values as a predetermined pattern as in the previous embodiment, and further in the present embodiment, the calorific values of the inner and outer regions of the disc heater 11 are uniformed by controlling the wire-like heating elements 30 and 30' of the sets individually.

Further, in the disc heater 11 of the embodiment shown in FIG. 9, each of the wire-like heating elements 30 and 30' and each of the power feeding portions 31, 31'; 32, 32' is formed by adhering stainless thin film for example on a back surface of a disc film made of one sheet of polyimide resin, and by etching a front surface of the thin film. A portion of a disc film body 18a of the disc heater 11 having the above-described structure, on which the wire-like heating elements 30 and 30' are formed, is integrally adhered to a thin disc A1 made of aluminum for example via an adhesive sheet. On the other hand, as can be understood in FIG. 9, each of the power feeding portions 31, 31'; 32, 32' is formed over substantially an entire region of a power-feeding-portion-forming region 18b made of insulative resin film, which extend in the outer diameter direction with a predetermined width and a predetermined length in the circumferential direction from a portion of the outer periphery of the disc film body 18a. Each of the wire-like heating elements 30 and 30' is connected to a portion of an end edge of the power feeding portions 31, 31'; 32, 32' at the side of the wire-like heating elements 30 and 30'.

With such a structure, when each of the wire-like heating elements 30 and 30' is connected to each of the power feeding portions 31, 31'; 32, 32' extending a peripheral edge of the aluminum thin disc A1 at acute angle, each of the connected portions of wire-like heating elements 30 and 30' are prone to be cut in many cases at the time of welding or mounting of the heater due to some external force. Further, at the time of the welding, each of the members is exposed to high temperature of about 300° C. Since thermal linear expansion coefficients of constituent materials of aluminum, polyimide resin, stainless and power feeding portions 31, 31'; 32, 32' are different, and under such high temperature, especially the power-feeding-portion-forming region 18b floats up, and wrinkles are generated.

Thereupon, in the present embodiment, in addition to the above structure, the wire-like heating elements 30 and 30' are formed in a predetermined pattern on the disc insulative resin film body 18a via a metal thin film. Further, in forming the power feeding portions 31, 31'; 32, 32' over substantially the entire surface of the power-feeding-portion-forming region 18b integrally extending from a portion of the peripheral edge of the disc insulative resin film body 18a with necessary width and length, end edges of the power feeding portions 31, 31'; 32, 32' closer to the wire-like heating elements 30 and 30' are made to extend to an inner diameter side beyond the peripheral edge of the insulative resin film body 18a, there is formed a slit-like power-feeding-portion-non-forming region 18c straightly extending in the outer diameter direction in an intermediate portion of said end edge. With this structure, the above-described wire cutting or wrinkles in the power-feeding-portion-forming region 18b are not generated. The shape of the power-feeding-portion-non-forming region 18c is not limited to the slit-like shape straightly extending in the diametric direction. It is possible to form the slit-like power-feeding-portion-non-forming region 18c having an arbitrary shape along a direction of current, i.e., along the current path.

Further, when a corner of a boundary portion between the insulative resin film body 18a and the power-feeding-portion-forming region 18b is an intersection of straight lines, the film itself is prone to be cut at the corner. Thereupon, in the present embodiment, the corner is made to be a curved line, and thin films 33 made of the same material as those of the wire-like heating elements 30 and 30' are formed on the film at the corner for reinforcing that portion.

The wire-like heating elements 30' of the auxiliary heater portion 11b are laid in a topology pattern so as to surround the entire outer periphery of the disc heater portion 11a by the auxiliary heater portion 11b except the gap 34 which is a region where the wire-like heating elements 30' are not laid. The power feeding portions 31 and 32 are connected to ends of the wire-like heating elements 30 of the disc heater portion 11a through the gap 34 formed in the auxiliary heater portion 11b. Thus, by connecting the wire-like heating elements 30 of the inside disc heater portion 11a to the power feeding portions 31 and 32 of the outer peripheral portion through the gap 34 in this manner, it is possible to form the disc heater portion 11a, the auxiliary heater portion 11b and the power feeding portions 31, 32; 31', 32' on the same plane, and to make the front and back surfaces of the disc heater 11 smooth and flat.

Further, by forming the power feeding portions 31, 32; 31', 32' to the two heater portions 11a and 11b around the outer peripheral portions, it becomes unnecessary to lay electricity feeding wires below the disc heater 11, and it is possible to avoid the inconvenience that the temperature distribution is made nonuniform due to the wires. Further, in this case, when the power feeding portions 31, 32 of the disc heater portion 11a and the power feeding portions 31', 32' of the auxiliary heater portion 11b are disposed adjacent to each other as shown in FIG. 9, the wiring cords for feeding electricity to the two sets of the power feeding portions 31, 32; 31', 32' can be laid at one position, which is preferable.

Figure 10:
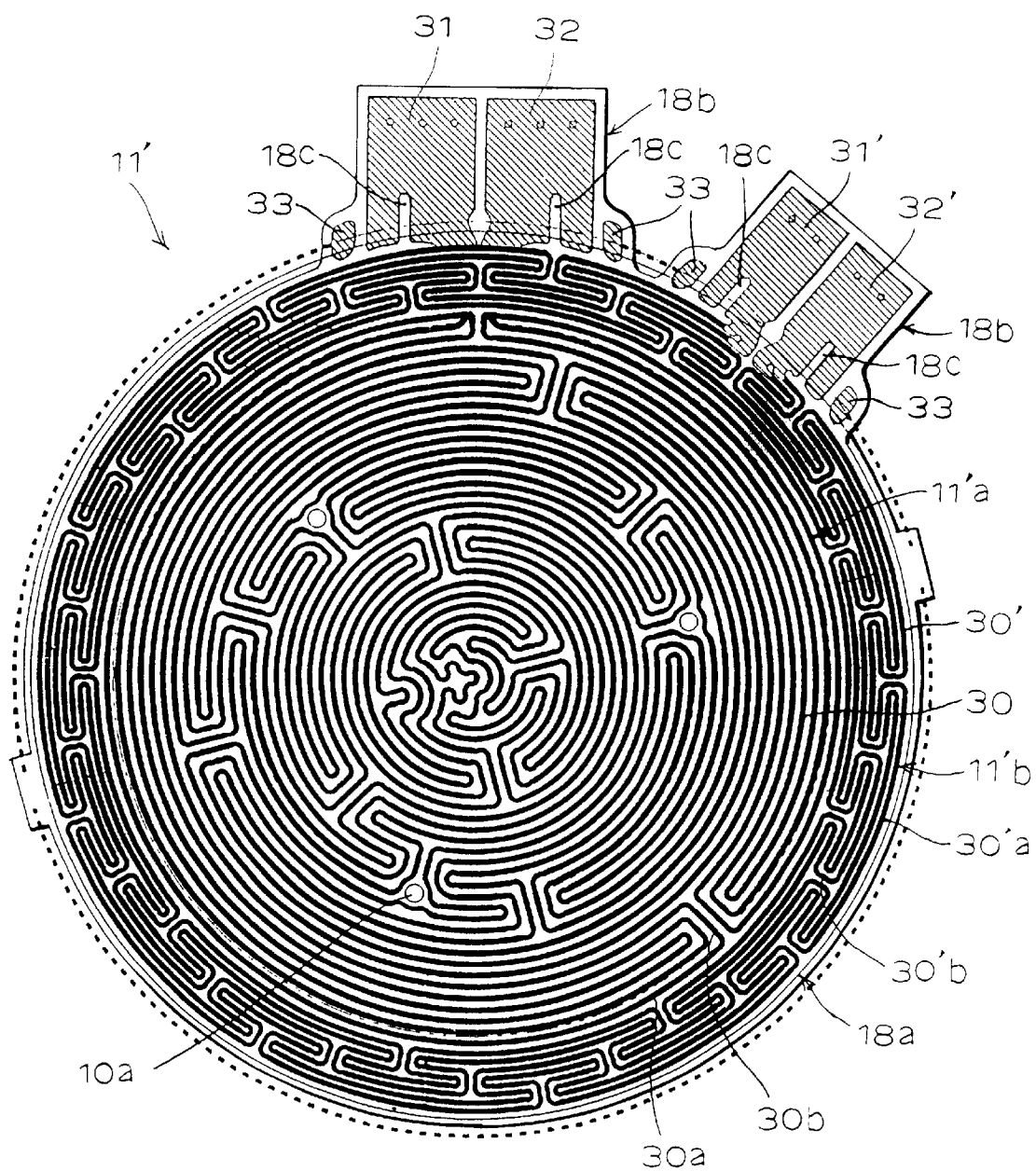
FIG. 10 is a plan view of a disc heater as a modification of the above-mentioned embodiment.

FIG. 10 shows a modification of the disc heater shown in FIG. 9. This disc heater 11' also comprises a center disc heater portion 11'a and an auxiliary heater portion 11'b provided around an outer periphery of the center disc heater portion 11'a like the disc heater shown in FIG. 9. However, the disc heater 11' of the present modification is different from the embodiment shown in FIG. 9 in that the auxiliary heater portion 11'b is substantially formed around the entire outer periphery of the disc heater portion 11'a, and there is no gap 34.

That is, in the disc heater 11' of the present modification, two sheets from which the power-feeding-portion-forming regions 18b are integrally extended from portions of the outer periphery of the disc film body 18a. The center disc heater portion 11'a and its power feeding portions 31 and 32 are laid on the one of the sheets, while the outer peripheral auxiliary heater portion 11'b and its power feeding portions 31' and 32' are laid on the other sheet. Both the sheets are adhered to each other to form the one disc heater 11'.

Figure 11:
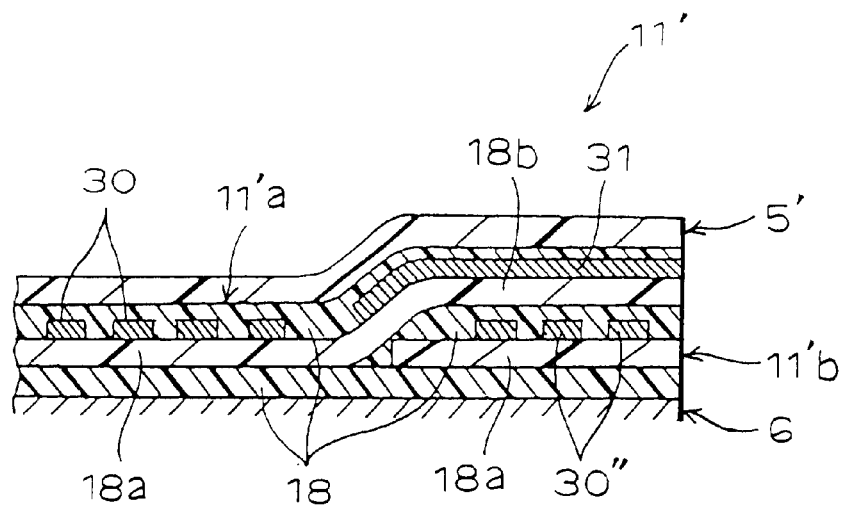
FIG. 11 is a sectional view of an essential portion of one example of the disc heater shown in FIG. 10.
Figure 12:
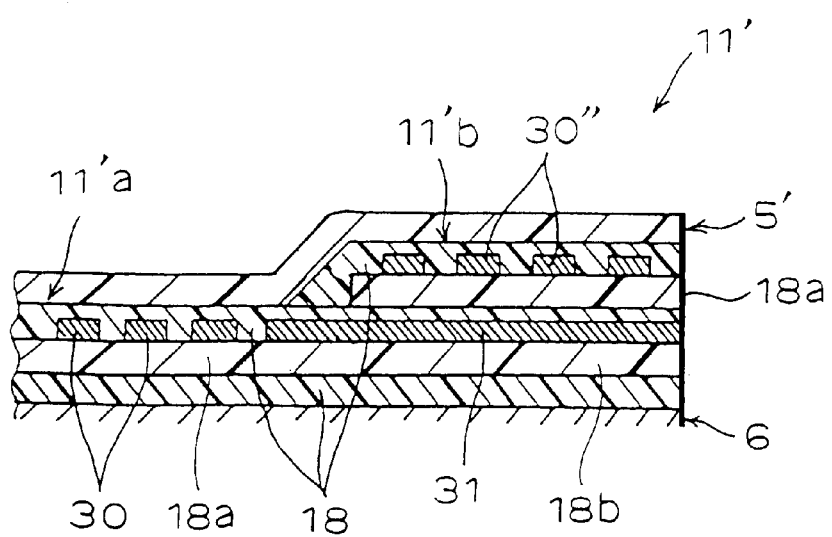
FIG. 12 is a sectional view of an essential portion of another example of the disc heater shown in FIG. 10.

In such a disc heater 11', the power feeding portions 31 and 32 of the disc heater portion 11'a are disposed on a front side of the auxiliary heater portion 11' as shown in FIG. 11, or on back side of the auxiliary heater portion 11' as shown in FIG. 12 via insulation layers, and are connected to ends of the wire-like heating elements 30 of the disc heater portions 11'a.

By disposing the power feeding portions 31 and 32 of the disc heater portion 11'a on either front or back side of the auxiliary heater portion 11'b via the insulation layers in this manner, it is unnecessary to form a gap 34 in the wire pattern of the auxiliary heater portion 11b unlike the embodiment shown in FIG. 9, and nonuniformity of heat slightly generated in the gap can be avoided. Therefore, it is possible to achieve higher thermal uniformity.

In the present modification, it is possible to adhere an insulation resin sheet 5' on an entire surface of the outermost layer of the disc heater 11' and to place the semiconductor wafer W directly on the upper surface thereof, so that the upper circular thin plate 5 of the temperature control apparatus 1 can be omitted.

In the above modification, it is important that the power feeding portions 31 and 32 of the disc heater portion 11'a are disposed on either front or back side of the auxiliary heater portion 11'b via the insulative layer. Any modification is possible only if this condition is satisfied. For example, the disc heater portion 11'a, the auxiliary heater portion 11'b and the power feeding portions 31' and 32' of the auxiliary heater portion 11'b may be laid on a single insulative resin sheet, and through holes may be formed in the sheet at ends of the wire-like heating elements 30 of the disc heater portion 11'a, the ends of the wire-like heating elements 30 may be inserted to the back surface side, and the power feeding portions 31 and 32 of the disc heater portions 11'a laid on a different sheet may be adhered from the back surface side.

Figure 13:
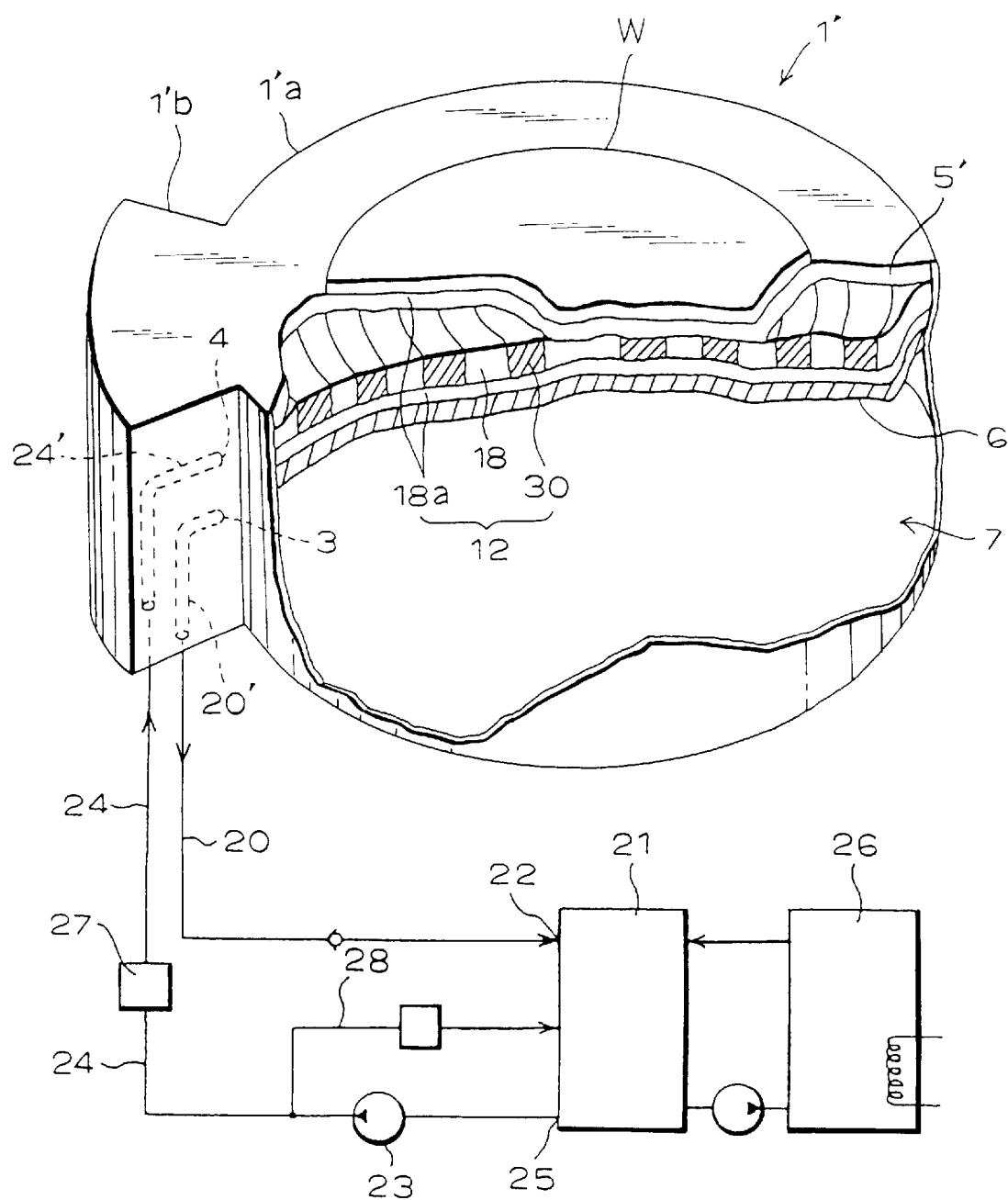
FIG. 13 is a partly broken perspective view showing another embodiment of a temperature control apparatus for heating and cooling a semiconductor wafer to which a disc heater of the present invention is applied.

FIG. 13 is a partly broken perspective view of a temperature control apparatus 1' of an embodiment different from the temperature control apparatus 1 shown in FIG. 1. The temperature control apparatus 1' of this embodiment heat and cool a semiconductor wafer to which a disc heater of the present invention is applied. In the temperature control apparatus 1', members substantially similar to those of the temperature control apparatus 1 shown in FIG. 1 are designated with the same reference numerals, so detailed explanation thereof is omitted here.

This temperature control apparatus 1' has, at a portion of an outer periphery of a hollow columnar portion 1'a thereof, a closed container having a rectangular portion 1'b whose cross section is substantially rectangular shape. A disc heater 12 having substantially the same shape as that of an upper surface of the closed container is disposed on upper surfaces of the columnar portion 1'a and the rectangular portion 1'b of the closed container. A surface of a portion of the disc heater 12 corresponding to the columnar portion 1a is a table surface for the object to be processed (semiconductor wafer W).

Below the disc heater 12, a thin plate 6 of about 0.5 mm made of material having high thermal conductivity such as aluminum, aluminum alloy or alumina is disposed. A cooling portion is formed on a back surface side of the disc heater 12 and the thin plate 6. It is preferable that thickness of the disc heater 12 and the thin plate 6 superposed on each other is 5 mm or less, and the overall thickness of the temperature control apparatus 1' is set 2 cm or less.

The cooling portion includes a cooling fluid supplying/discharging space 7 formed between the thin plate 6 and a lower wall of the disc columnar portion 1'a, a cooling fluid introducing port 4 and a cooling fluid discharging port 3 leading to the supplying/discharging space 7. A cooling fluid dispersion member 9 of the temperature control apparatus 1 as shown in FIG. 1 is not provided in the present embodiment. Therefore, cooling fluid is directly supplied to the supplying/discharging space 7 from the cooling fluid introducing port 4, and the supplying/discharging space 7 is filled with the cooling fluid to cool the semiconductor wafer W on the table surface. The cooling fluid introducing port and the cooling fluid discharging port 3 to the supplying/discharging space 4 are formed on a peripheral wall of the columnar portion 1'a having the rectangular portion 1'b on its one side, a supplying pipe 24' and a discharging pipe 20' to the cooling fluid introducing port 4 and the cooling fluid discharging port 3 are formed in the rectangular portion 1'b for filling the supplying/discharging space 7 with cooling fluid by introducing and discharging the fluid.

Figure 14:
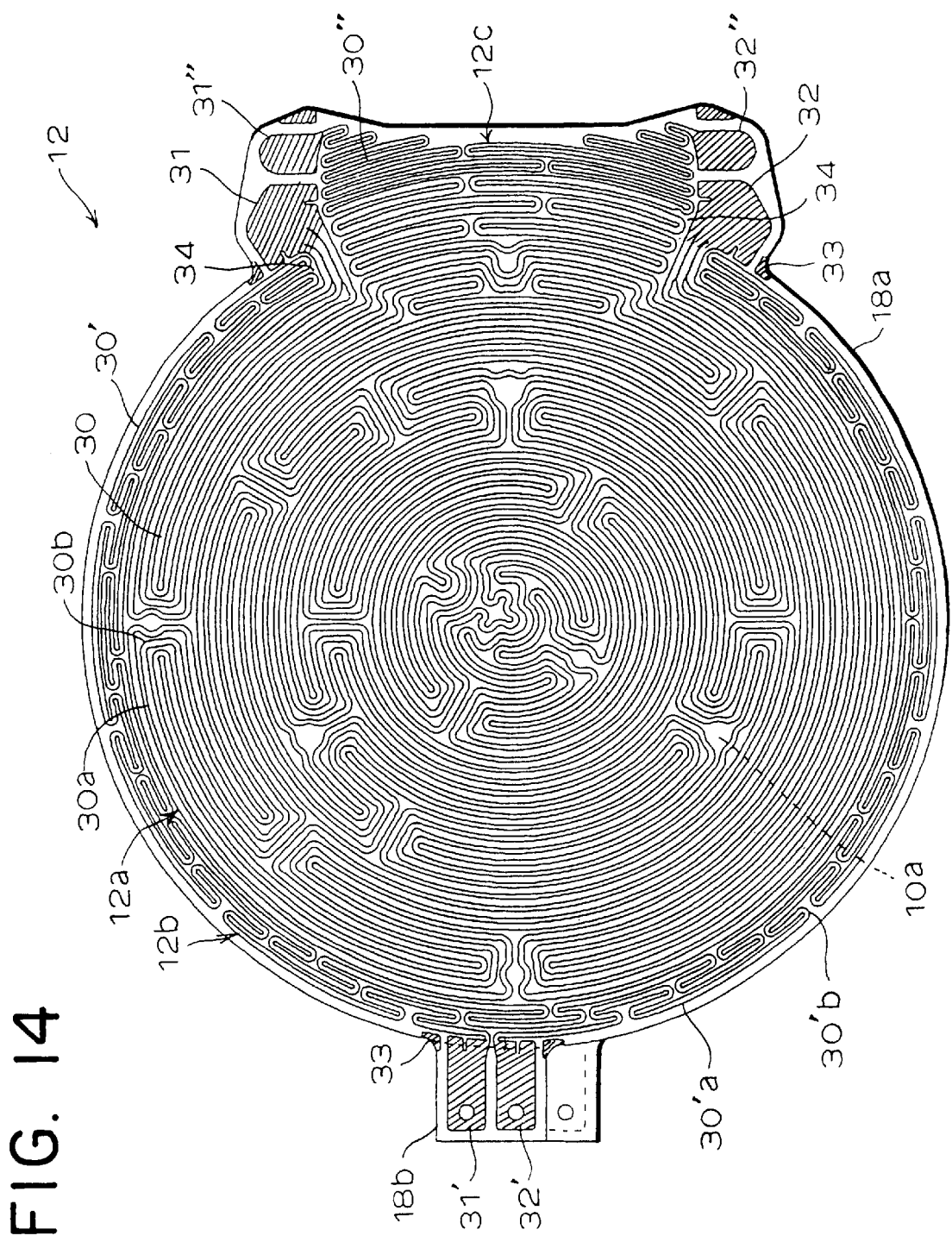
FIG. 14 is a plan view of the disc heater as a typical embodiment which is applied to the temperature control apparatus shown in FIG. 13.
Figure 15:
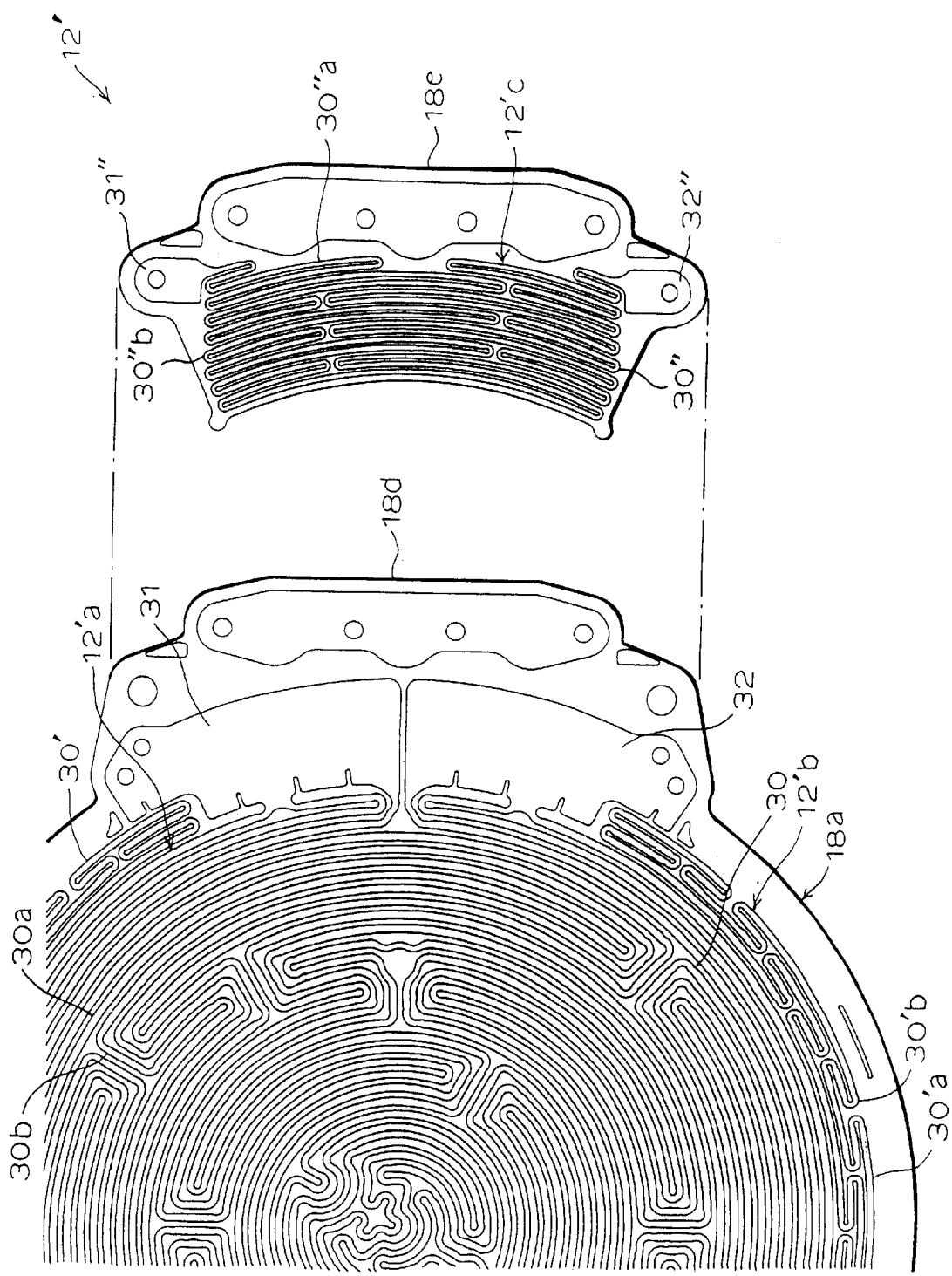
FIG. 15 is a partial plan view showing an exploded disc heater of another embodiment which is applied to the temperature control apparatus shown in FIG. 13.
Figure 16:
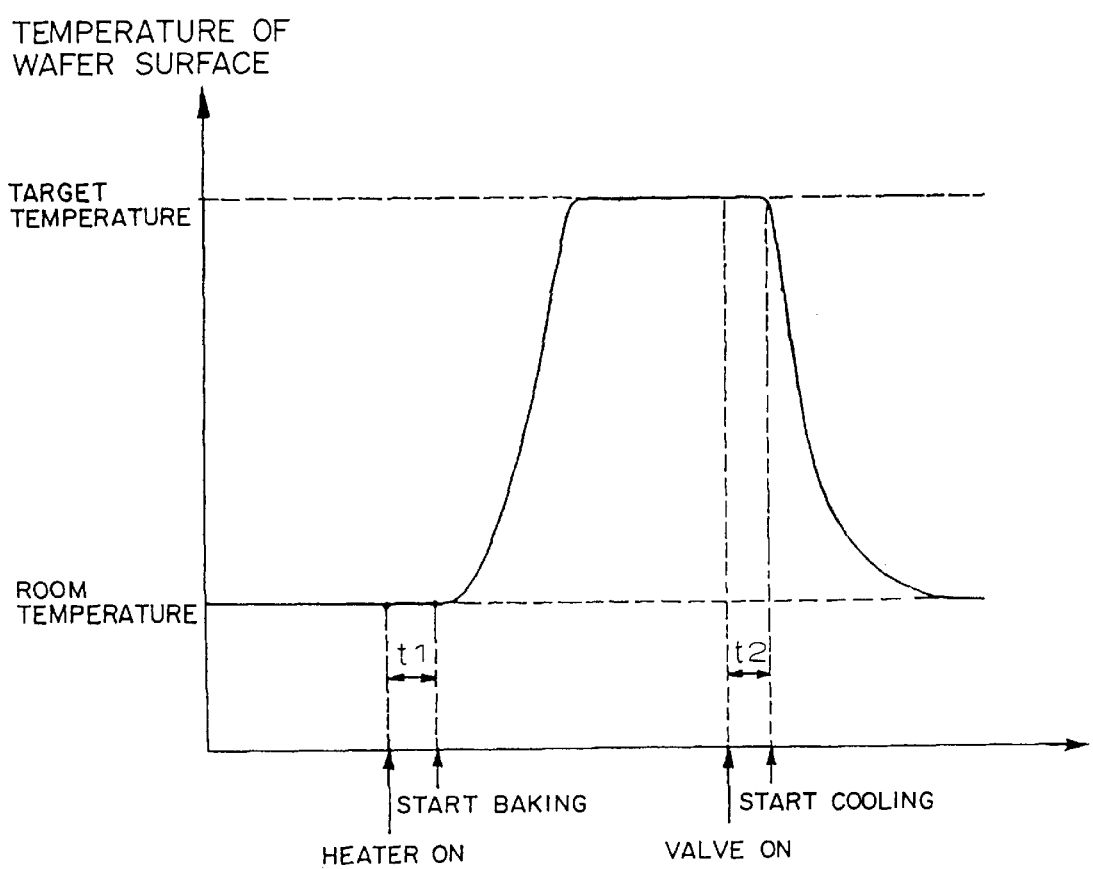
FIG. 16 is a diagram showing heating and cooling temperature cycles in processing procedure of this kind.

FIGS. 14 and 15 show examples of topology patterns of the wire-like heating elements 30 in the disc heater 12 of the present invention, which is applied to the temperature control apparatus 1' shown in FIG. 13. The disc heater 12 has the same shape as that of the upper surface of the temperature control apparatus 1', and is formed such that a rectangular portion is formed on a portion of the outer periphery of the circle portion.

The disc heater 12 shown in FIG. 14 forms a topology pattern in which three sets of wire-like heating elements 30, 30' and 30" are used on a single insulative resin sheet from which a rectangular region 18d extends from an outer periphery of a disc film body 18a in an outer diametric direction. That is, in one of the sets, three wire-like heating elements 30 are connected to one set of power feeding portions 31 and 32 in parallel, and in other two sets, one wire-like heating element 30' and one wire-like heating element 30" are connected to the other two sets of power feeding portions 31', 32'; 31" and 32", respectively.

The three wire-like heating elements 30 form a topology pattern of the disc heater portion 12a in a center region of the disc film body 18a. Further, a topology pattern is formed on an outer periphery of the disc heater portion 12a except a portion in which the one wire-like heating element 30' is adjacent to the rectangular region 18d, thereby constituting a first auxiliary heater portion 12b. The other single wire-like heating element 30" forms a topology pattern in the above-described exceptional portion and the rectangular region 18d, thereby constituting a second auxiliary heater portion 12c. In the topology pattern of each of the wire-like heating elements 30, 30' and 30", arc portions 30a, 30'a and 30"a and connecting portions 30b, 30'b and 30"b are formed into predetermined patterns as in the previous embodiment, thereby enhancing the uniformity of the calorific value.

The power feeding portions 31, 32; 31" and 32" of the disc heater portion 12a and the second auxiliary heater portion 12c are formed on opposite sides of the second auxiliary heater portion 12c of the rectangular region 18d. In this state, an outer periphery of the disc heater portion 12a is surrounded by the first auxiliary heater portion 12b and the second auxiliary heater portion 12c, but a gap 34 is formed between the first auxiliary heater portion 12b and the second auxiliary heater portion 12c. Therefore, the power feeding portions 31 and 32 of the disc heater portion 12a can be connected to ends of the wire-like heating elements 30 of the disc heater portion 12a through the gap 34. The power-feeding-portion-forming region 18b having a predetermined width and length extends in the outer diametric direction from the disc heater body 18a at position displaced by 180° from the rectangular region 18d. The power-feeding-portion-forming region 18b is formed with power feeding portions 31' and 32' for the first auxiliary heater portion 12b.

Further, in the disc heater 12, the wire-like heating elements 30, 30' and 30" are individually controlled. In the circle portions of the wire-like heating elements 30, 30' and 30", the disc heater portion 12a and the first auxiliary heater portion 12b are individually controlled for deleting temperature difference by difference in heat releasing amount between the center region and the peripheral region. Further, the second auxiliary heater portion 12c of the rectangular portion also individually is controlled separately from the disc heater portion 12a and the first auxiliary heater portion 12b, thereby deleting the temperature difference in the vicinity of the cooling fluid introducing port 3. Therefore, the calorific value over the entire surface of the disc heater 12 can be uniformed.

FIG. 15 is a partial plan view showing an exploded disc heater 12' of a modification of the above-described disc heater 12. In the disc heater 12' of the present modification also, three sets of wire-like heating elements 30, 30' and 30" are used to constitute a disc heater portion 12'a, a first auxiliary heater portion 12'b on an outer periphery side of the disc heater portion 12'a and a second auxiliary heater portion 12'c of a rectangular portion. A topology pattern of each of the wire-like heating elements 30, 30' and 30" is formed so as to uniform the calorific value of the arc portions 30a, 30'a and 30"a and the connecting portions 30b, 30'b and 30"b in the same predetermined pattern as that of the previous embodiment, and to control each of the wire-like heating elements 30, 30' and 30" individually, thus uniforming the heat.

However, in the disc heater 12' shown in FIG. 15, the disc film body 18a is provided with the disc heater portion 12'a and the first auxiliary heater portion 12'b, and the rectangular region 18d extending outward of the disc film body 18a has at its entire surface power feeding portions 31 and 32 of the disc heater portion 12'a. Further, the wire-like heating elements 30" of the second auxiliary heater portion 12'c and its power feeding portion 31" and 32" are laid on another rectangular film 18e having substantially the same shape as that the rectangular region 18d, and are adhered to the rectangular region 18d.

At that time, likewise the modification shown in FIG. 10, the rectangular film 18e may be mounted from a lower side of the rectangular region 18d or may be mounted from an upper side of the rectangular region 18d, as shown in FIGS. 11 and 12. However, in this case, an insulator must be interposed between the power feeding portions 31 and 32 of the disc heater portion 12'a formed in the rectangular region 18d and the wire-like heating elements 30" of the second auxiliary heater portion 12'c laid on the rectangular film 18e and the power feeding portions 31" and 32".

By disposing the power feeding portions 31 and 32 of the disc heater portion 12'a on either front or back side of the second auxiliary heater portion 12'c via the insulative layer in this manner, it is unnecessary to form a gap in the wire pattern of the auxiliary heater portion as in the embodiment shown in FIG. 14, so that non-uniformity of heat slightly generated in the gap portion can be avoided and therefore, it is possible to achieve higher thermal uniformity.

In the temperature control apparatuses 1 and 1' of the above embodiments, the disc heaters 10 and 12 are disposed only on their surfaces, but the disc heaters 10 and 12 may be disposed on both the front and back surfaces thereof via cooling portions. In this case, the object to be processed can be heated and cooled at both the surfaces. Also when the object to be processed is heated and cooled at only one surface, by cooling and heating the other surface, it is possible to avoid warpage of the temperature control apparatuses 1 and 1' which is prone to be generated when the heating treatment and cooling treatment are switched.

In the temperature control apparatus 1' in which the cooling fluid supplying pipe 24' and the cooling fluid discharging pipe 20' are disposed on one side of the apparatus 1', the cooling fluid introducing port 4 and the cooling fluid discharging port 3 are provided in the side wall, and the disc heater 12 is disposed also on the surface of the rectangular portion 1'b so that portion of the wafer W corresponding to the introducing port 4 and the discharging port 3 may not be unevenly heated. For this purpose, the disc heater 12 has such a shape that the rectangular portion is added to the outer periphery of the circle portion as shown in FIGS. 14 and 15, but the present invention is not limited to a disc heater having this shape.

For example, the rectangular portion 1'b may be provided in plural, and the cooling fluid supplying pipe 24' and the cooling fluid discharging pipe 20' can be disposed at a plurality of positions. In this case also, disc heaters are disposed on surfaces of the plurality of rectangular portions 1'b, and the rectangular regions are individually controlled. In the temperature control apparatus 1 shown in FIG. 1, the upper thin plate 5 is disposed on the upper surface of the disc heater 10, but in the temperature control apparatus 1' shown in FIG. 13, the upper thin plate 5 is omitted, in which case, the wafer W is directly placed on the insulative film 5' of the outermost layer of the disc heater 12.

Further, in each of the temperature control apparatuses 1 and 1', the cooling fluid is supplied to and discharged from the supplying/discharging space 7 disposed at the back surface side of the disc heater 10 or 12 to cool the object to be processed which is placed on the surface, but heating fluid may be supplied to and discharged from the supplying/discharging space 7 instead of the cooling fluid. In this case, it is possible to finely adjust the heating temperature by the disc heaters 10 and 12 using the heating fluid. Alternatively, if a path for the heating fluid to the supplying/discharging space 7 is further disposed in addition to the path of the cooling fluid, and a valve capable of selectively introducing one of the cooling fluid and the heating fluid to the supplying/discharging space 7 is provided, the temperature control apparatuses 1 and 1' can be provided with cooling function by the cooling fluid and heating function by the heating fluid. Further, the disc heaters 10 and 12 can be provided on both the upper and lower surfaces of the supplying/discharging space 7.

As can be understood from the above description, the main topology pattern of the wire-like heating elements 30, 30' and 30" of the disc heaters 10 and 12 of the present invention is such that the arc portions 30a are superposed concentrically several times, and the connecting portions 30b are eliminated to the utmost and therefore, the local excessively heated portions are reduced and the durability is enhanced. Further, the calorific value can be uniformed over the entire heating surface, and the heating and cooling treatments with respect to the object to be processed can easily be controlled by the ideal processing process. Furthermore, the present invention is not limited to the heating apparatus of this kind, and the invention can be applied to heating apparatuses of various fields.

The above embodiments and the modifications are only described with only typical examples for understanding the present invention. For example, the present invention is not limited to the above-described processing which repeats the heating and cooling treatments, but the disc heaters 10 and 12 in which the wire-like heating elements are substantially uniformly disposed may be disposed between upper and lower thin plates having small thermal capacities, so that it is possible to efficiently heat the object to be processed and releases the heat from the object to be processed under the uniform temperature distribution. Therefore, the present invention can be applied also to an apparatus which singly heats or cools, and it will easily be understood that a person skilled in the art can variously change the present invention without departing from the spirit of the invention.

What is claimed is:

1. A disc heater applied to a temperature control apparatus which controls temperature of an object to be processed on at least one surface thereof, in which plural wire-like heating elements are laid on a plate surface in a predetermined pattern and at least one power feeding portion is disposed at ends of said wire-like hearing elements, wherein said pattern formed by said wire-like heating elements comprises a number of arc portions disposed on a number of concentric circles, connecting portions sequentially connecting one end of each of said arc portions with one end of each said arc portions toward a center, and arc portions on concentric circles having another concentric center which is different from that of said concentric circle, and a surface area of said arc portions is 85 to 95% of a surface area of the entire pattern, and said wire-like heating elements are connected to said at least one power feeding portion in parallel.

2. A disc heater according to claim 1, wherein said connecting portions are disposed so as to be dispersed in different diametric regions on the concentric circles.

3. A disc heater according to claim 1, wherein surface areas of said wire-like heating elements per unit length are substantially equal in a longitudinal direction thereof, and said wire-like heating elements constituting said pattern are disposed at the same intervals.

4. A disc heater according to claim 1, wherein an entire surface area of said wire-like heating elements is 45% or greater than an area of a region of said plate where said wire-like heating elements are disposed.

5. A disc heater according to claim 1, wherein said disc heater has around its outer periphery one or more auxiliary heater portions in which a wire-like heating element different from said heater for uniforming thermal distribution of said disc heater is laid.

6. A disc heater according to claim 5, wherein said auxiliary heater portion is formed such that a gap is remained on a portion of an entire outer periphery of said disc heater, and said at least one power feeding portion of said disc heater is connected to ends of said wire-like heating elements of said disc heater through said gap of said auxiliary heater portion.

7. A disc heater according to claim 5, wherein said auxiliary heater portion is formed over substantially an entire periphery of said disc heater, said at least one power feeding portion of said disc heater is disposed on either front or back side of said auxiliary heater portion via an insulative layer, and is connected to the end of said wire-like heating elements of said disc heater.

8. A disc heater applied to a temperature control apparatus which controls temperature of an object to be processed on at least one surface thereof, wherein plural wire-like heating elements laid on a disc insulative resin film body via a metal thin film are formed in a predetermined pattern that comprises a number of arc portions disposed on a number of concentric circles, and connecting portions sequentially connecting one end of each of said arc portions with one end of each of said arc portions toward a center, a surface area of said arc portions is 85 to 95% of a surface area of the entire pattern, a power-feeding-portion-forming region comprising an insulative resin film is integrally extended from a portion of a peripheral edge of said disc insulative resin film body with predetermined width and length, said power feeding portion is formed over substantially an entire surface of said power-feeding-portion-forming region, an end edge of said power feeding portion at a side of said wire-like heating elements is formed so as to extend to an inner side of said insulative resin film body beyond its peripheral edge, and a slit-like power feeding portion-non-forming region extending along a current path is formed at an intermediate portion of said end edge.

9. A disc heater according to claim 8, wherein said disc heater has around its outer periphery one or more auxiliary heater portions in which a wire-like heating element different from said heater for uniform thermal distribution of said disc heater is laid.

10. A disc heater according to claim 9, wherein said auxiliary heater portion is formed such that a gap remains on a portion of an entire outer periphery of said disc heater, and said at least one power feeding portion of said disc heater is connected to ends of said wire-like beating elements of said disc heater through said gap of said auxiliary heater portion.

11. A disc heater according to claim 9, wherein said auxiliary heater portion is formed over substantially an entire periphery of said disc heater, said at least one power feeding portion of said disc heater is disposed on either a front or back side of said auxiliary heater portion via an insulative layer, and is connected to the ends of said wire-like heating elements of said disc heater.

12. A disc heater according to claim 8, wherein a thin film is formed at a boundary portion between a periphery of the disc insulative resin film body and said power-feeding-portion-forming region.

13. A temperature control apparatus in which a disc heater on which plural wire-like heating elements are laid in a predetermined pattern is disposed on at least one surface thereof for controlling a temperature of an object to be processed at said surface, wherein said pattern formed by said wire-like heating elements comprises a number of arc portions disposed on a number of concentric circles, connecting portions sequentially connecting one end of each of said arc portions with one end of each of said arc portions toward a center, and arc portions on concentric circles having another concentric center which is different from that of said concentric circle, and a surface area of said arc portions is 85 to 95% of a surface area of the entire pattern, said wire-like heating elements are connected to said at least one power feeding portion in parallel, and a heating/cooling portion by heating/cooling fluid is provided on a front and/or a back surface of said disc heater.

* * * * *